United States Patent [19]

Akiyama et al.

[11] Patent Number: 5,392,246

[45] Date of Patent: Feb. 21, 1995

[54] SEMICONDUCTOR MEMORY WITH MULTIPLE SETS & REDUNDANT CELLS

[75] Inventors: Noboru Akiyama, Katsuta; Kinya Mitsumoto, Tamamuramachi; Takashi Akioka; Seigoh Yukutake, both of Hitachi, all of Japan

[73] Assignee: Hitachi, Ltd., Tokyo, Japan

[21] Appl. No.: 205,161

[22] Filed: Mar. 3, 1994

[30] Foreign Application Priority Data

Mar. 3, 1993 [JP] Japan ................................ 5-042362
Aug. 20, 1993 [JP] Japan ................................ 5-206372

[51] Int. Cl.$^6$ .............................................. G11L 7/00
[52] U.S. Cl. ............................ 365/200; 365/189/07; 371/10.3
[58] Field of Search .................. 365/200, 189.07; 371/10.1, 10.2, 10.3

[56] References Cited

U.S. PATENT DOCUMENTS 5,195,057  3/1993  Kasa et al. ............................ 365/200
5,278,839  1/1994  Matsumoto et al. .................. 365/200

Primary Examiner—Eugene R. LaRoche
Assistant Examiner—Christopher R. Glembocki
Attorney, Agent, or Firm—Antonelli, Terry, Stout & Kraus

[57] ABSTRACT

An area of a semiconductor chip, on which a memory is disposed, is divided into a plurality of memory blocks and redundant memory blocks, each memory block is divided into a plurality of unit arrays of columns for replacing, each redundant memory block is divided into a plurality of unit arrays of redundant columns, a plurality of memory cells are disposed in each unit array of columns for replacing and each unit array of redundant columns, a memory cell group in each unit array of columns for replacing is connected to a word line and a data line, a redundant memory cell group of each unit array of redundant columns is connected to a redundant word line and a redundant data line, a first data selection circuit for controlling data selection with respect to the unit array of redundant columns is disposed in each memory block, a second data selection circuit for controlling data selecting with respect to the unit array group of redundant columns is disposed in each redundant memory block, and a third data selection circuit for selecting and transmitting only data selected either of the data selection circuit is disposed, wherein, if each memory block has no defect, data selected by the first data selection circuit, that is, data selected from the unit array of columns for replacing of each memory block is transmitted as it is by way of the third data selection circuit, if any one of the memory blocks has a defect, data selection with respect to the unit array of columns for replacing that has encountered the defect is inhibited, the unit array of redundant columns of the redundant memory block is instructed in place of the unit array of columns for replacing that has encountered the defect, and data is, by the second data selection circuit, selected from the selected unit array of redundant columns in place of the replacement unit array that has encountered the defect as to transmit the selected data by way of the third data selection circuit.

31 Claims, 22 Drawing Sheets

FIG. 19

BLK 0

| $\overline{X10}$ | $\overline{Y12}$ | RES |
|---|---|---|
| L | L | L |
| L | H | L |
| H | L | L |
| H | H | H |

BLK 1

| X10 | $\overline{Y12}$ | RES |
|---|---|---|
| H | L | L |
| H | H | H |
| L | L | L |
| L | H | L |

BLK 2

| $\overline{X10}$ | Y12 | RES |
|---|---|---|
| L | H | L |
| L | L | L |
| H | H | H |
| H | L | L |

BLK 3

| X10 | Y12 | RES |
|---|---|---|
| H | H | H |
| H | L | L |
| L | H | L |
| L | L | L |

$\overline{X10} = X10B$, $\overline{Y12} = Y12B$

H : HIGH LEVEL
L : LOW LEVEL

FIG. 20

BLK 0

| $\overline{X10}$ | $\overline{Y12}$ | RES |
|---|---|---|
| L | L | L |
| L | H | H |
| H | L | L |
| H | H | H |

BLK 1

| X10 | $\overline{Y12}$ | RES |
|---|---|---|
| H | L | L |
| H | H | H |
| L | L | L |
| L | H | H |

BLK 2

| $\overline{X10}$ | Y12 | RES |
|---|---|---|
| L | H | H |
| L | L | L |
| H | H | H |
| H | L | L |

BLK 3

| X10 | X12 | RES |
|---|---|---|
| H | H | H |
| H | L | L |
| L | H | H |
| L | L | L |

$\overline{X10} = X10B$, $\overline{Y12} = Y12B$

H : HIGH LEVEL
L : LOW LEVEL

SEMICONDUCTOR MEMORY WITH MULTIPLE SETS & REDUNDANT CELLS

BACKGROUND OF THE INVENTION

1. Field of the Invention

The present invention relates to a semiconductor memory, and more particularly to a semiconductor memory of a type having a redundant memory cell group serving as a sub-memory disposed in addition to a memory cell group formed into blocks disposed on a chip of the semiconductor as to use the redundant memory cells if a portion of the common memory cells has encountered a defect.

2. Related Background Art

Hitherto, a semiconductor memory, and more particularly, a MOS memory has been used recently as a large scale and ultra high speed memory. Although an attempt has been made to raise the degree of integration of a semiconductor memory by employing MOS memory, a defect occurring in the process of manufacturing the MOS memories arises a problem of deterioration in the manufacturing yield. That is, even if one memory cell among a plurality of memory cells has a problem during a process of manufacturing highly integrated MOS memories, the overall advantage of the memory cells is lost, causing the yield to deteriorate when the memory capacity is intended to be enlarged.

In order to improve the manufacturing yield of the memories, technology has been suggested which comprises sub-memory cells previously disposed on the chip in addition to a common memory cell group as to be used if a problem takes place among the common memory cells.

If a semiconductor memory having a total storage capacity of 16 megabits is constituted for example, a process is employed which comprises the steps of: a plurality of memory cells are divided into 8 memory blocks before they are disposed; each memory block is divided into 16 memory mats; each memory mat is divided into 8 unit arrays for replacing; each memory mat is constituted by a plurality of memory cell columns commonly having a division word line; and a redundant row array and a redundant column array are disposed in each 2 megabit memory block, wherein each unit array for replacing is replaced by the redundant column array if any one of data lines of a memory mat in each memory block has encountered a problem.

Structures relating to the foregoing technology are exemplified by disclosures filed in Japanese Patent Laid-Open No. 59-135700, Japanese Patent Laid-Open No. 3-105799, Japanese Patent Laid-Open No. 3-15078, Japanese Patent Laid-Open No. 3-1627995, Japanese Patent Laid-Open No. 2-208897 and U.S. patent Ser. No. 4,473,895.

However, the foregoing conventional technology sometimes encounters a problem in that, if defects of data lines or the like have concentrically taken place in one block, the number of redundant columns of the redundant memory cell array becomes short, and accordingly replacement cannot be performed. If three unit arrays for replacing of the memory mat has encountered defects in a case where two redundant column arrays are disposed in each block for example, two unit arrays for replacing can be replaced by the redundant column arrays. However, the residual unit array for replacing cannot be replaced.

In order to prevent the foregoing problem, it might be feasible to increase the number of redundant column arrays. However, employment of the foregoing structure causes the regions of the redundant column arrays to increase in each memory block, and therefore the area of the chip is enlarged excessively.

SUMMARY OF THE INVENTION

Accordingly, an object of the present invention is to provide a semiconductor memory of a type capable of replacing an area in a certain block in which defects have concentrically been taken place.

Another object of the present invention is to provide a semiconductor memory capable of changing the memory array range which can be replaced by one redundant replacement unit memory array in accordance with a state of the generated defect.

In order to achieve the foregoing objects, the present invention is directed to replace the defective column by arranging a semiconductor memory in such a manner that an area of the semiconductor chip is divided into a plurality of memory blocks and redundant memory blocks, each memory block is divided into a plurality of unit arrays of columns for replacing, each redundant memory block is divided into a plurality of unit arrays of redundant columns, a plurality of memory cells are disposed in each unit array of columns for replacing and each unit array of redundant columns, a memory cell group in each unit array of columns for replacing is connected to a word line and a data line, a redundant memory cell group of each unit array of redundant columns is connected to a redundant word line and a redundant data line, a first and second data selection means for controlling data selection with respect to the unit array of redundant columns are disposed in each memory block, and a third data selection means for selecting and transmitting only data selected either of the data selection means is disposed, wherein, if each memory block has no defect, data selected by the first data selection means, that is, data selected from the unit array of columns for replacing of each memory block is transmitted as it is by way of the third data selection means, if any one of the memory blocks has a defect, data selection with respect to the unit array of columns for replacing that has encountered the defect is inhibited, the unit array of redundant columns of the redundant memory block is instructed in place of the unit array of columns for replacing that has encountered the defect, and data is, by the second data selection means, selected from the selected unit array of redundant columns in place of the replacement unit array that has encountered the defect as to transmit the selected data by way of the third data selection means.

Specifically, the first data selection means is constituted in such a manner that, if a selected unit array of columns for replacing in a unit array group of columns has no defect, the first data selection means transmits a signal from the data line in accordance with a command and inhibits signal output from the data line regardless of the command if it has a defect. The second data selection means is constituted as to inhibit signal output from the redundant data line regardless of the command if the unit array of redundant columns in the unit array group of redundant columns is not used and transmit a signal from the redundant data line in accordance with the command if a selected unit array of redundant columns is used. The third data selection means is constituted in such a manner that it selects and transmits either of data selected by the first data selection means or data selected by the second data selection means.

The first data selection means can be constituted by a plurality of word line selection means which respond to a specific word line selection signal generated in accordance with an address signal as to transmit a memory cell drive signal to a selected word line among a word line group of each unit array of columns for replacing; a plurality of data line selection means which respond to a specific data line selection signal generated in accordance with an address signal as to transmit a signal of a selected data line among a data line group of each unit array of columns for replacing; a plurality of column replacement unit array selection signal generating means for generating a signal for selecting a unit array of columns for replacing for selecting an array among a group of unit arrays of columns for replacing in each memory mat on the basis of a signal group generated in accordance with the address signal; and a plurality of data line signal transfer control means which respond to the column replacement unit array selection signal as to transmit a signal selected by each data line selection means to a main data output line if the selected unit array of columns for replacing has no defect and inhibit the transmission of the signal selected by each data line selection means to the main data output line if the selected unit array of columns for replacing has no defect.

The second data selection means can be constituted by a plurality of redundant word line selection means for transmitting a memory cell drive signal to an instructed redundant word line among a redundant word line group of each unit array of redundant columns in response to a selected redundant word line selection signal generated in accordance with the address signal; a plurality of redundant data line selection means for transmitting a signal from an instructed redundant data line among a redundant data line group in each unit array of redundant columns in response to a selected redundant data line selection signal generated in accordance with the address signal; redundant column replacement unit array selection signal generating means for generating redundant column replacement unit array selection signal for selecting an array among a redundant column replacement unit array group of the redundant memory block on the basis of a signal group generated in accordance with the address signal; and a plurality of redundant data line signal transfer control means which respond to the redundant column replacement unit array selection signal to transmit a signal selected by each redundant data line selection means to a redundant data output line when the selected unit array of redundant columns is used and inhibit transfer of the signal selected by each redundant data line selection means to a redundant data output line.

The third data selection means can be constituted by a data output line selection means for connecting the redundant data output line, which is connected to each redundant data line signal transfer control means, to each selected main data output line.

More specifically, each of the data selection means is constituted in such a manner that data line selection means comprises a data line selection decoder which responds to a specific logic among logics which are combinations of block selection signals, column selection signals and mat selection signals generated from the address signal as data line selection signals as to transmit a data line activating signal, and a column switch circuit for transmitting a signal from a selected data line in response to a data line activating signal supplied from the data line selection decoder.

The redundant data line selection means can be constituted by a redundant data line selection decoder which responds to a specific logic among logics which are combinations of the block selection signals, column selection signals and mat selection signals generated from the address signal as data line selection signals as to transmit a redundant data line activating signal, and a redundant column switch circuit for transmitting a signal supplied from a selected redundant data line in response to a redundant data line activating signal supplied from the redundant data line selection decoder.

The column replacement unit array selection signal generating means can be constituted by an array selection decoder which responds to a specific logic among logics which are combinations of the block selection signals and the mat selection signals generated from the address signal as to generate a column replacement unit array selection signal.

The redundant column replacement unit array selection signal generating means can be constituted by a plurality of fuses disposed to correspond to signal lines of a logical signal group which are combinations of the block selection signals and the mat selection signals generated from the address signal, a plurality of gate circuits which receive a logical signal among a logical signal group which is combinations of the block selection signals and the mat selection signals generated from the address signal as to transmit the supplied logical signal as it is if the fuse is not interrupted and transmit the same while inverting the logic of the supplied logical signal, and a redundant array selection decoder which receives the logical signal supplied from each gate circuit and which responds to a specific logic among logics which are combinations of the logical signal groups as to generate a redundant column replacement unit array selection signal.

Each word line selection means can be constituted by a main word line selection decoder which responds to a specific logic among logics which are combinations of the main word selection signals and the block selection signals generated from the address signal as signals for simultaneously selecting a plurality of word lines as to transmit a main word line selection command signal, a main word driver circuit which responds to the main word line selection command signal as to transmit a main word line drive signal to a selected main word line, a sub-word line selection decoder which responds to a specific logic among logics which are combinations of the block selection signals, the mat selection signals and row selection signals generated from the address signal as signals for selecting one word line as to transmit a sub-word line selection command signal, and a sub-driver circuit which responds to the main word line drive signal and the sub-word line selection command signal as to transmit a memory cell drive signal to a selected word line group.

The redundant word line selection means can be constituted by a redundant main word line selection decoder which responds to a specific logic among logics which are combinations of the main word selection signals and the block selection signals generated from the address signal as signals for simultaneously selecting a plurality of redundant word lines as to transmit a redundant main word line selection command signal, a redundant main driver circuit which responds to the redundant main word line selection command signal as to transmit a redundant main word line drive signal to a selected redundant main word line; a redundant sub-word line selection decoder which responds to a specific logic among logics which are combinations of the block selection signals, the mat selection signals and the row selection signals generated from the address signal as signals for selecting one redundant word line as to transmit a redundant sub-word line selection command signal; and a redundant sub-driver circuit which responds to the redundant main word line drive signal and the redundant sub-word line selection command signal as to transmit a memory cell drive signal to a selected redundant word line group.

The data line signal transfer control means can be constituted by a fuse connected to a power source, a defect discrimination circuit which transmits a defect signal denoting that the unit array of columns for replacing has a defect if the fuse has been interrupted and transmits a non-defect signal denoting that the unit array of columns for replacing has no defect if the fuse is not interrupted, a control signal generating circuit which responds to the column replacement unit array selection signal only under condition that the non-defect signal has been generated from the defect discrimination circuit as to transmit an activation control signal and transmit a turning-off signal in the residual cases, and a signal transfer control circuit which responds to the activating control signal supplied from the control signal generating circuit as to transmit a signal supplied from the data line to a main data output line and which responds to the turning-off signal as to inhibit signal transfer from the data line to the main data output line.

The redundant data line signal transfer control means can be constituted by a fuse connected to the power source, an array usage discrimination circuit which transmits an array usage command signal for commanding use of the unit array of redundant columns if the fuse has been interrupted and which transmits an array usage inhibition signal for inhibiting use of the unit array of redundant columns if the fuse is not interrupted, a redundant control signal generating circuit which responds to the redundant column replacement unit array selection signal only under condition that the array usage command signal has been generated from the array usage discrimination circuit as to transmit an activating signal and transmit a turning-off signal in the residual cases, and a redundant signal transfer control circuit which responds to the activating control signal supplied from the redundant control signal generating circuit as to transmit a signal supplied from the redundant data line to the redundant data output line and which responds to the turning-off control signal as to inhibit signal transfer from the redundant data line to the redundant data output line.

In order to replace a defective row, the memory cell group in each memory block is constituted by a plurality of row replacement unit arrays or a plurality of redundant row replacement unit arrays, first and second data selection means for controlling data selection are disposed in each row replacement unit array group in each memory block and each redundant memory block and a third data selection means for selecting and transmitting only data selected either of the data selection means is disposed, wherein, if each memory block has no defect, data selected from the unit array of rows for replacing of each memory block is transmitted as it is, if any one of the memory blocks has a defect, data selection with respect to the unit array of rows for replacing that has encountered the defect is inhibited, the unit array of redundant rows of the redundant memory block is instructed in place of the unit array of rows for replacing that has encountered the defect, and data is selected from the selected unit array of redundant rows in place of the replacement unit array that has encountered the defect as to transmit the selected data. In this case, each data selection means may has the function similar to that for sue to replace the defective column.

The range which can be replaced by the redundant memory block is determined, and the memory in the thus-determined range is replaced in such a manner that the semiconductor memory chip having a similar function to that of the foregoing semiconductor memory is divided into a plurality of replacement areas and the replacement area is instructed depending upon the redundant memory block in accordance with the state of defect generation.

Specifically, the structure is arranged in such a manner that each redundant memory block comprises a plurality of word line selection means which respond to a specific word line selection signal generated in accordance with an address signal as to transmit a memory cell drive signal to a selected word line among word line groups of each unit array of columns for replacing; a plurality of data line selection means which respond to a specific data line selection signal generated in accordance with an address signal as to transmit a signal of a selected data line among data line groups of each unit array of columns for replacing; a plurality of column replacement unit array selection signal generating means for generating a signal for selecting a unit array of columns for replacing for selecting an array among a group of unit arrays of columns for replacing in each memory mat on the basis of a signal group generated in accordance with the address signal; a plurality of data line signal transfer control means which respond to the column replacement unit array selection signal as to transmit a signal selected by each data line selection means to a main data output line if the selected unit array of columns for replacing has no defect and inhibit the transmission of the signal selected by each data line selection means to the main data output line if the selected unit array of columns for replacing has no defect; a redundant memory block group having a plurality of unit arrays of redundant columns in each of which redundant memory cell groups connected to redundant data lines and redundant word lines are disposed to correspond to unit arrays of columns for replacing; a plurality of redundant word line selection means for transmitting a memory cell drive signal to an instructed redundant word line among redundant word line groups of each unit array of redundant columns in response to a selected redundant word line selection signal generated in accordance with the address signal; a plurality of redundant data line selection means for transmitting a signal from an instructed redundant data line among redundant data line groups in each unit array of redundant columns in response to a selected redundant data line selection signal generated in accordance with the address signal; redundant column replacement unit array selection signal generating means for generating redundant column replacement unit array selection signal for selecting an array among a redundant column replacement unit array group of the redundant memory block on the basis of a signal group generated in accordance with the address signal; a plurality of redundant data line signal transfer control means which respond to the redundant column replacement unit array-selection signal to transmit a signal selected by each redundant data line selection means to a redundant data output line when the selected unit array of redundant columns is used and inhibit transfer of the signal selected by each redundant data line selection means to a redundant data output line; data output line selection means for connecting the redundant data output line, which is connected to each redundant data line signal transfer control means, to each selected main data output line; replacement area selection signal generating means for generating a replacement area selection signal which determines the range which can be replaced by the redundant memory block group in accordance with the address signal; a plurality of redundant word line selection operation control means which enable a selected redundant word line selection means to perform a selection operation only under condition that the replacement area selection signal has been generated and which forcibly stop the selection operation in the residual cases; a plurality of redundant data line selection operation control means which enable a selected redundant data line selection means to perform a selection operation only under condition that the replacement area selection signal has been generated and which forcibly stop the selection operation in the residual cases; and a plurality of redundant column replacement unit array selection signal generation operation control means which enable a selected redundant column replacement unit array selection signal generating means to perform a generation operation only under condition that the replacement area selection signal has been generated and which forcibly stop the generation operation in the residual cases.

When the foregoing semiconductor memory is embodied, the replacement area selection signal generating means may comprise a plurality of fuses connected to the power source, a plurality of signal generating circuits for generating different signals depending upon whether or not each fuse has been interrupted, and a replacement area selection signal generating circuit which responds to a specific logic among logics which are combinations of a signal supplied from each signal generating circuit and block selection signals generated from the address signal as to generate a replacement area selection signal.

The foregoing means causes data selected from the unit array group of columns for replacing in each memory block to be transmitted as it is if each memory block has no defect. If any one of the memory blocks has a defect, data selection with respect to the defective replacement unit array is inhibited. In place of the unit arrays of columns for replacing, a unit array of redundant columns in a redundant memory block is instructed so that selected data from a selected unit array of redundant columns is transmitted in place of the unit arrays of columns for replacing that has encountered the defect. Therefore, even if defects have taken place concentrically in a specific memory block, the unit array group of redundant columns in the redundant memory block is used in place of the unit arrays of columns for replacing that has encountered the defect so that the defective column can be replaced and therefore the replacement can be performed further freely.

According to the embodied means, if no defect, such as no defect of a data line, has taken place in the unit arrays of columns for replacing, the signal generated in accordance with the address signal is used to select a specific memory block in the memory block group and select a memory mat so that a signal from a selected data line among a data line group in each unit array of columns for replacing is transmitted to the main data output line in response to the word line selection signal and the data line selection signal.

If any one of the unit arrays of columns for replacing has encountered a defect, such as a defective data line, a column replacement unit array selection signal for selecting the unit array of columns for replacing, which has encountered the defect, is generated. Further, a redundant column replacement unit array selection signal for selecting an array from a redundant column replacement unit array group in the redundant memory block is generated. Further, the redundant data output line connected to the redundant data line signal transfer control means is connected to a selected main data output line. When access is given to the unit arrays of columns for replacing during a process in which access is sequentially given to each unit array of columns for replacing in response to a signal generated in accordance with the address signal after the foregoing process has been performed, signal output from the data line of the unit arrays of columns for replacing, which has encountered the defect, to the main data output line is inhibited. At this time, access is given to a selected unit array of redundant columns in the redundant memory block, and a signal of the data line of the unit array of redundant columns is transmitted to the selected main data output line by way of the redundant data output line. That is, if any one of the unit arrays of columns for replacing has encountered a defect, the data output from the unit arrays of columns for replacing, which has encountered the defect, is inhibited. As an alternative to this, data of a selected a unit array of redundant columns in the redundant memory block is transmitted. Even if unit arrays of columns for replacing in any memory block has encountered a defect, a column replacement unit array selection signal for selecting the unit arrays of columns for replacing, which has encountered the defect, is generated. Further, a redundant column replacement unit array selection signal is generated to correspond to the unit arrays of columns for replacing which has encountered the defect. In addition, the redundant data output line connected to the foregoing unit array of redundant columns is connected to the selected main data output line. Therefore, even if defects, such as a defect of a data line, have taken place concentrically in a specific memory block, the defective memory block can be replaced so that the replacement can be performed further freely.

If a unit arrays of rows for replacing of a row replacement semiconductor memory has encountered a defect, unit arrays of rows for replacing of the redundant memory block can be used in place of the unit arrays of rows for replacing, which has encountered the defect, similarly to the case of the column replacement semiconductor memory.

In a case where access is given to a column replacement semiconductor memory of a row replacement semiconductor memory, access is given to the unit arrays of columns for replacing or unit arrays of rows for replacing in any memory block regardless of a defect in the unit arrays of columns for replacing or unit arrays of rows for replacing as to inhibit data output from the unit arrays of columns for replacing or unit arrays of rows for replacing which have encountered the defect. As an alternative to this, data from the unit array of redundant columns or a unit array of redundant rows in the redundant memory block is transmitted. Therefore, a necessity of generating an address signal for inhibiting the selection of the unit array of redundant columns or the unit array of redundant rows which have encountered the defect can be eliminated. As a result, generation of delay time taken to transmit data from a selected memory cell can be prevented.

Since a column or row replacement semiconductor memory of a type having a plurality of redundant memory blocks and arranged in such a manner that the memory is divided into a plurality of replacement areas is subjected to an examination of the state of defect generation after the chip has been manufactured before a replacement area which can be replaced by the redundant memory block is programmed by using a means such as a fuse, the number of memory blocks that can be replaced by one redundant memory block can be changed. Therefore, if the concentrated defects or generation of defects is limited, the replacement area that can be replaced by the redundant memory block is limited depending upon the state of defect generation. As a result, the replacement can be performed quickly and the electric current consumption in the chip can be reduced.

Other and further objects, features and advantages of the invention will be appear more fully from the following description.

BRIEF DESCRIPTION OF THE DRAWINGS

FIG. 19 is a view which illustrates the logic structure of a block selection signal formed when both of fuses 1010 and 1011 are turned on;

FIG. 20 is a view which illustrates the logic structure of a block selection signal formed when the fuse 1010 is turned off and fuse 1011 is turned on;

DESCRIPTION OF THE PREFERRED EMBODIMENTS

An embodiment of the present invention will now be described with reference to the drawings.

Referring to FIGS. 1 to 4, a semiconductor chip has a chip 100. The chip 100 has, thereon, a plurality of memory cells disposed while being divided into 8 memory blocks 200, the chip 100 further comprising two redundant-only-memory blocks 310 each of which comprises a redundant memory cell array (a sub-memory cell array).

Figure 1:
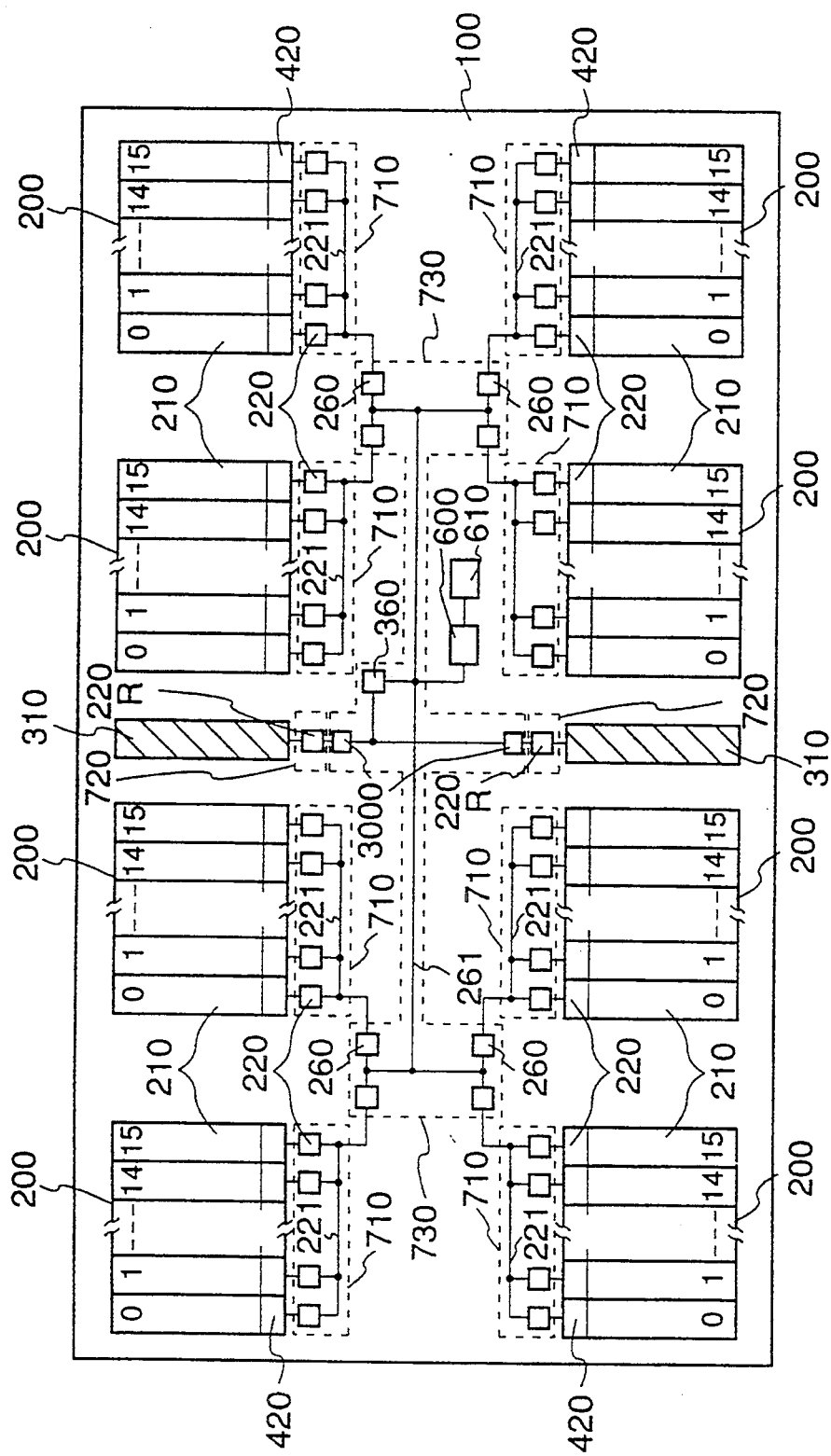
FIG. 1 is an overall structural view which illustrates a first embodiment of the present invention.
Figure 2:
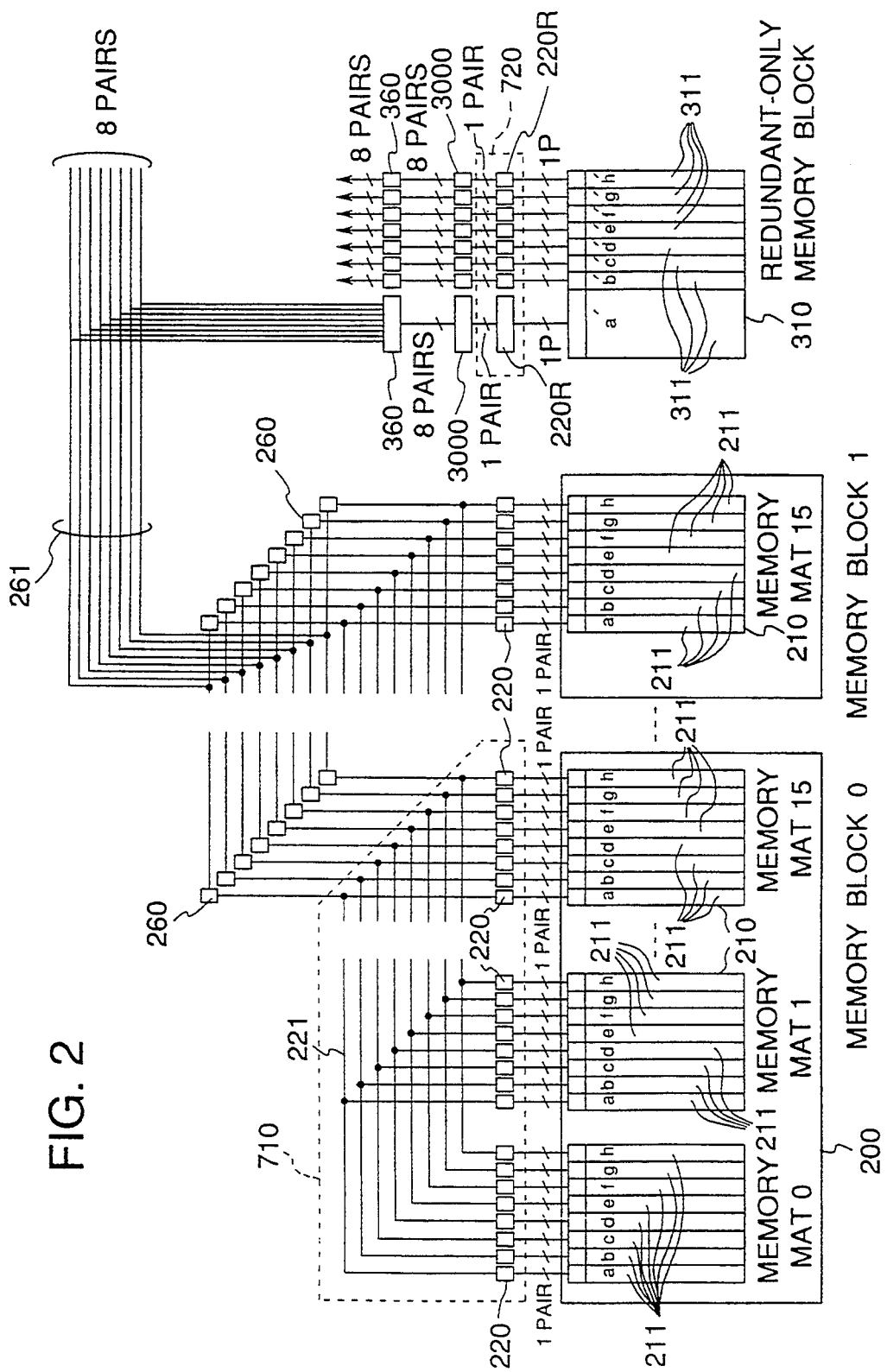
FIG. 2 is a view which explains the connection relation between memory blocks and redundant memory blocks.
Figure 3:
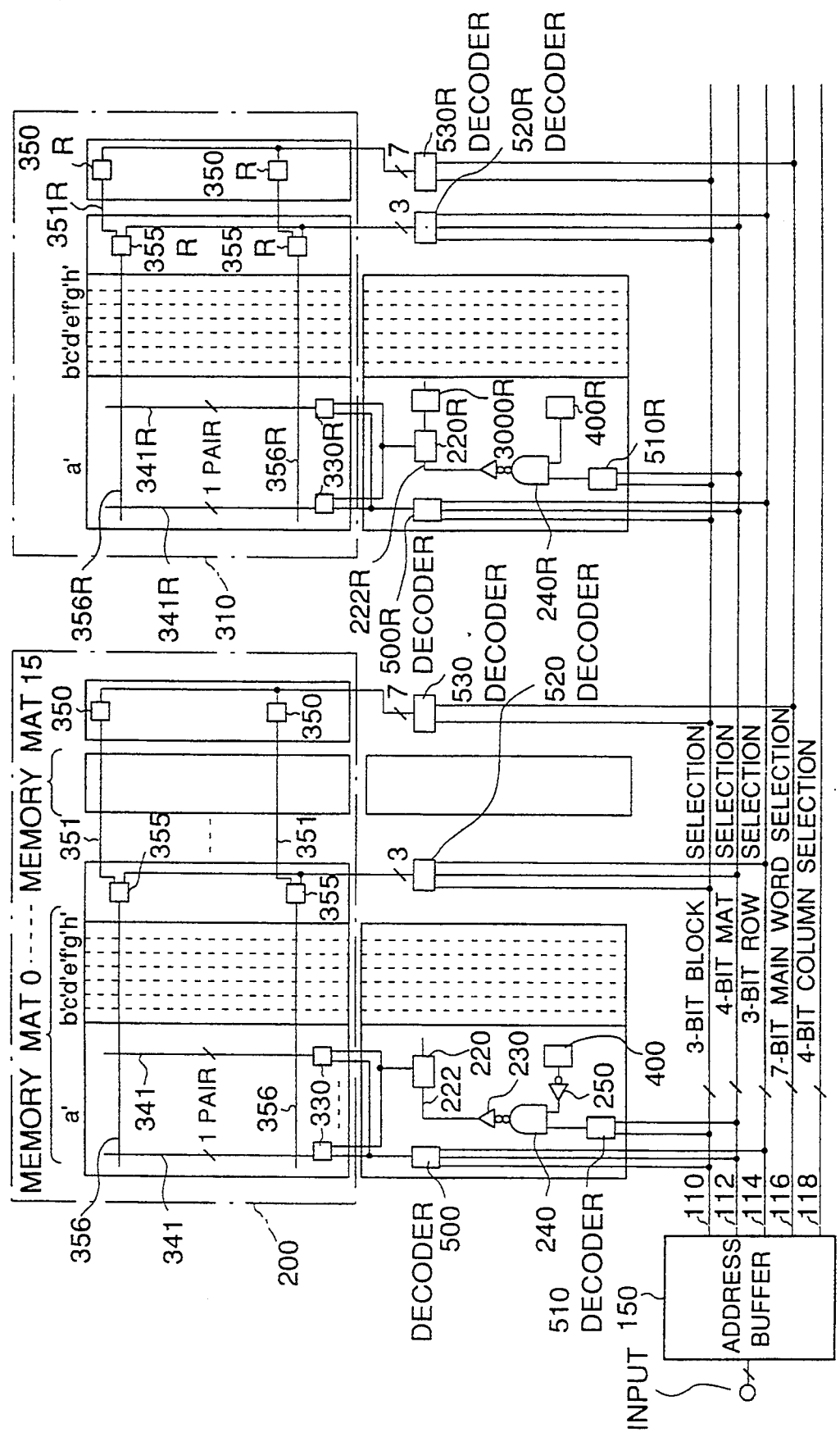
FIG. 3 is a circuit diagram according to the first embodiment.
Figure 4:
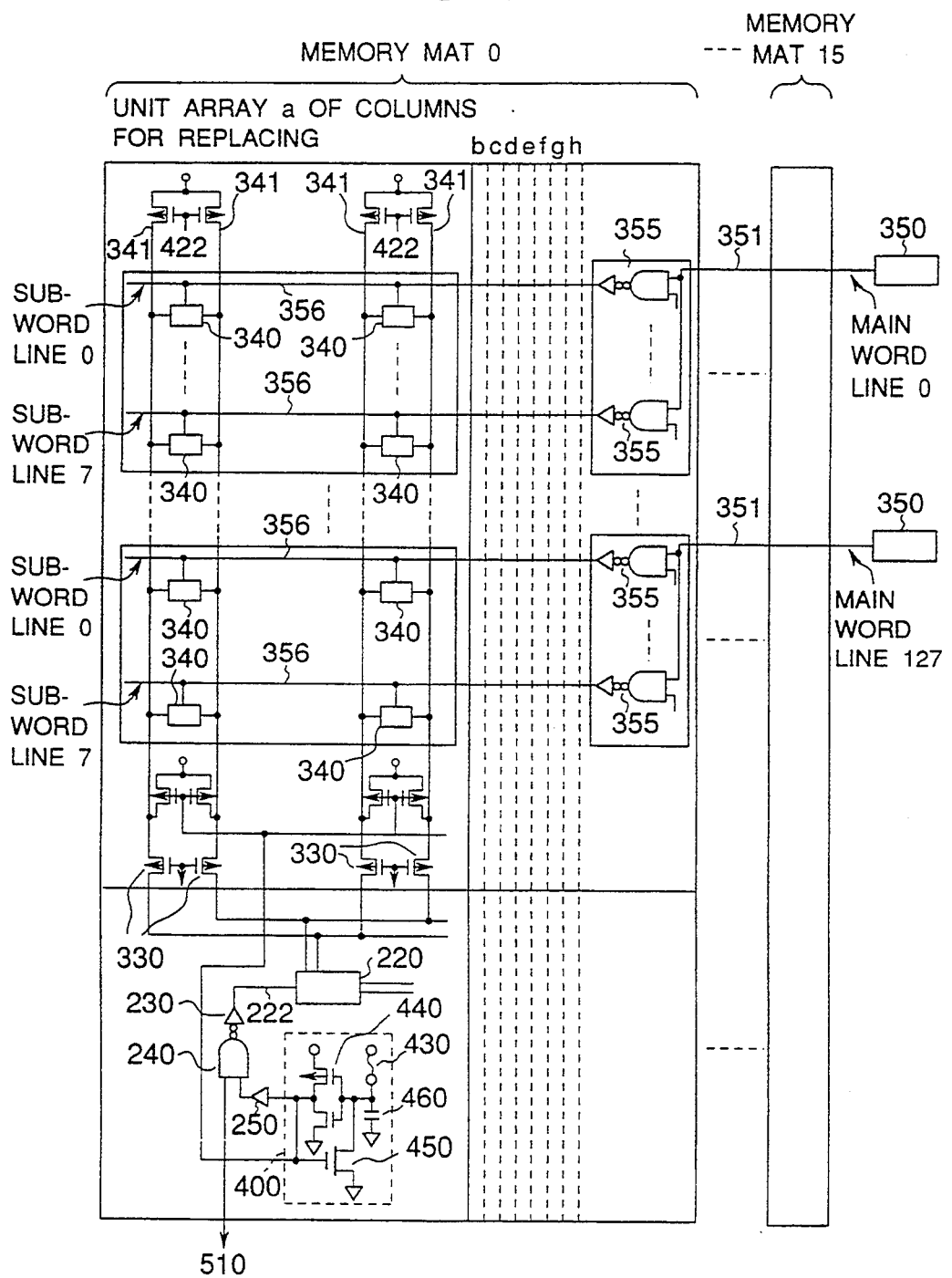
FIG. 4 is a specific structural view which illustrates a memory mat.

Each memory block 200, as shown in FIG. 3, comprises a memory cell array including a plurality of memory cell columns commonly having a main word line, the memory block 200 having a memory capacity of 2 megabits. Moreover, each memory block 200 is divided into 16 memory mats 210 (#0 to #15 memory mats), each memory mat 210 being divided into 8 unit arrays 211 (#a to #h) of columns for replacing, as shown in FIG. 2. Each memory mat 210 comprises a memory cell array formed by a plurality of memory cell columns commonly having a sub-word line 356, each memory mat 210, as shown in FIG. 1, having a redundant row array 420 therein. One memory mat 210 has a memory capacity of 128 kilo-bits (128 columns × 1024 rows). The unit array 211 of columns for replacing has a memory capacity of 16 kilo-bits (16 columns × 1024 rows).

Each redundant-only memory block 310 is formed by 8 unit arrays 311 (#a' to #h') of redundant columns and having a memory capacity of 128 kilo-bits (128 columns × 1024 rows). Each unit array 311 of redundant columns has a memory capacity of 16 columns × 1024 rows similarly to the unit array 211 of columns for replacing of the memory block 200.

Each unit array 211 of columns for replacing has 16 kilo (1024 × 16) redundant memory cells 340R (shown in FIG. 8) disposed therein. Each memory cell 340 has one sub-word line 356 and a pair of data lines 341 connected thereto. Each redundant memory cell 340R has one redundant sub-word line 356R and a pair of redundant data lines 341R. Each of the sub-word lines (a total of 1024 lines are disposed) 356 are connected to a main word driver 350 by way of sub-word drivers 355 (a total of 1024 drivers are disposed) and a main word line 351. Each redundant sub-word line 356R is connected to a redundant main word driver 350R by way of a redundant sub-word driver 355R and a redundant main word line 351R. In this structure, 128 main word lines 351 and 128 redundant main word lines 351R are disposed. The main word lines 351 and the redundant main word lines 351R respectively are connected to 8 sub-word drivers 355 and the redundant sub-word drivers 355R. That is, the 8 sub-word drivers 355 or 355R are operated in response to a signal supplied from a single main word driver 350 or the redundant main word driver 350R.

The pair of the data lines 341 are, by way of column switches 330, connected to a pre-sense amplifier 220, while the pair of the redundant data lines 341R are connected to a redundant pre-sense amplifier 220R by way of redundant column switches 330R. When any one of the column switches 330 or 330R is switched on in accordance with an address signal, one data item is supplied from the 8 (#a to #h) unit arrays 211 of columns for replacing or (#a' to #h') unit arrays 311 of redundant columns to each pre-sense amplifier 220 or 220R. That is, each of the memory blocks 200 or the redundant-only memory blocks 310 transmits 8-bit signals. When all unit arrays 211 of columns for replacing in each memory block 200 are normal, data supplied from each unit array 211 of columns for replacing is transmitted as it is by way of the pre-sense amplifier 220. It should be noted that FIG. 1 illustrates the structure of one bit of the 8 bits in order to simply make the description.

If the data line 341 of any one the unit arrays 211 of columns for replacing in the memory block 200 have encountered a defect, for example, if the #C and #f unit arrays 211 of columns for replacing have encountered defects, the pre-sense amplifier 220 connected to the defective unit array 211 of columns for replacing is turned off to inhibit data output when access has been given to the memory cell 340 in the unit array 211 of columns for replacing. Further, access is given to the redundant memory cell 340R in the #a' and #b' unit arrays 311 of redundant columns in place of the #c and #f unit arrays 211 of columns for replacing as to turn on the redundant pre-sense amplifier 220R so that data is transmitted from the redundant data line 341R.

A first data selection means 710 is disposed in each memory block 200 so that data transmitted from each memory block 200 is selected. Further, a second data selection means 720 is disposed in each redundant-only memory block 310 so that data transmitted from each redundant-only memory block 310 is selected. Further, a third data selection means 730 is disposed to select either of data selected by the first data selection means 710 or that selected by the second data selection means 720, the third data selection means 730 being connected to an output buffer 610 by way of a main sense amplifier 600. It should be noted that only the pre-sense amplifier 220 and the redundant pre-sense amplifier 220R are illustrated in FIGS. 1 and 2 as the first data selection means 710 and the second data selection means 720, respectively.

The specific structures of the first, second and the third data selections means 710, 720 and 730 will now be described.

The first data selection means 710 comprises a column switch 330, a main word driver 350, a sub-word driver 355, a pre-sense amplifier 220, an inverter 230, a NAND gate 240, an inverter 250, a fuse programming circuit 400, and decoders 500, 510, 520 and 530. The decoders 500 to 530 are connected to an address buffer 150 by way of corresponding signal lines 110 to 118. The address buffer 150 transmits a 3-bit block selection signal to the signal line 110, a 4-bit mat selection signal to the signal line 112, a 3-bit row selection signal to the signal line 114, a 7-bit main word selection signal to the signal line 116 and a 4-bit column selection signal to the signal line 118. The decoder 500 is arranged to receive the block selection signal, the mat selection signal and the column selection signal, while the decoder 510 is arranged to receive the block selection signal and the mat selection signal. The decoder 520 is arranged to receive the block selection signal, the mat selection signal and the row selection signal, while the decoder 530 is arranged to receive the block selection signal and the main word selection signal.

Figure 5:
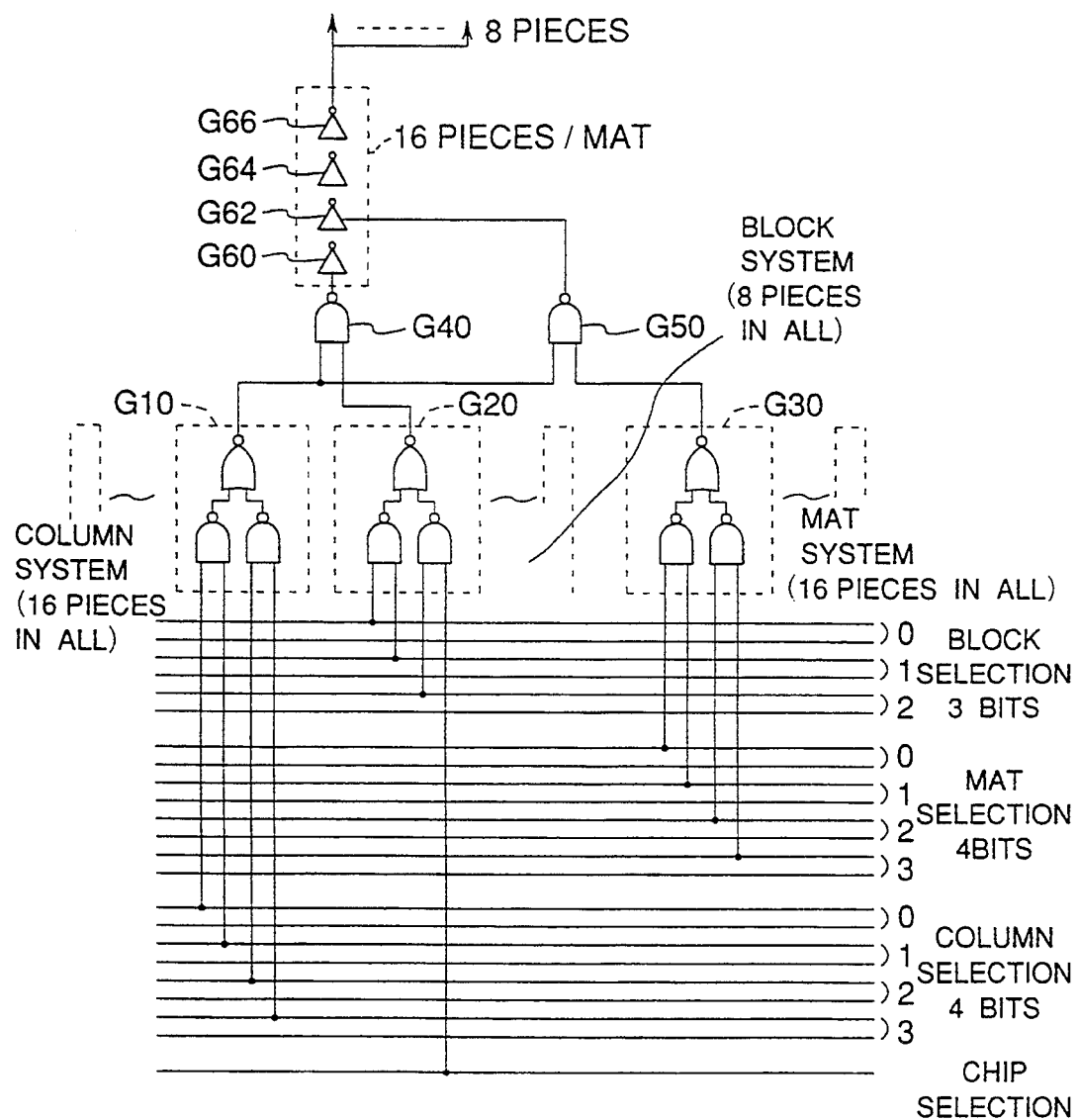
FIG. 5 is a structural view which illustrates a decoder for use in columns.

The decoder 500, as shown in FIG. 5, comprises 16 gate circuits G10 to respond to the column selection signal, 8 gate circuits G20 to respond to the block selection signal and the chip selection signal, and 16 gate circuits G30 to respond to the mat selection signal. Further, the decoder comprises NAND gates G40 and G50 and inverters G60, G62, G64 and G66. The decoder 500 responds to a specific logic of logics of combination of the mat selection signal, the block selection signal and the column selection signal generated as the word selection signal in accordance with an address signal as to transmits a switching signal to a specified column switch 330. That is, when a self block is selected in response to the block signal and a self memory mat is selected in response to the mat selection signal, a data line activating signal is transmitted to a specified column switch 330 in response to the column selection signal. A signal from the data line 341 connected to the activated column switch 330 is transmitted to the pre-sense amplifier 220. That is, the decoder 500 is arranged to serve as a data line selecting decoder, while the column switch 330 is arranged to serves as a column switch circuit. The decoder 500 and the column switch 330 form a data line selection means.

The decoder 510 is disposed for each unit array of columns for replacing, the decoder 510 being arranged to serve as an array selecting decoder which receives the block selection signal and the mat selection signal supplied from the address buffer 150 as to generate a signal for selecting a specified unit array of columns for replacing in response to a specific logic among the logics of the combinations of the foregoing signals. That is, the decoder 510 is arranged to serve as a means for generating the signal for selecting the unit array of redundant for replacing which transmits the signal for selecting the unit array of redundant for replacing to the NAND gate 240.

Figure 6:
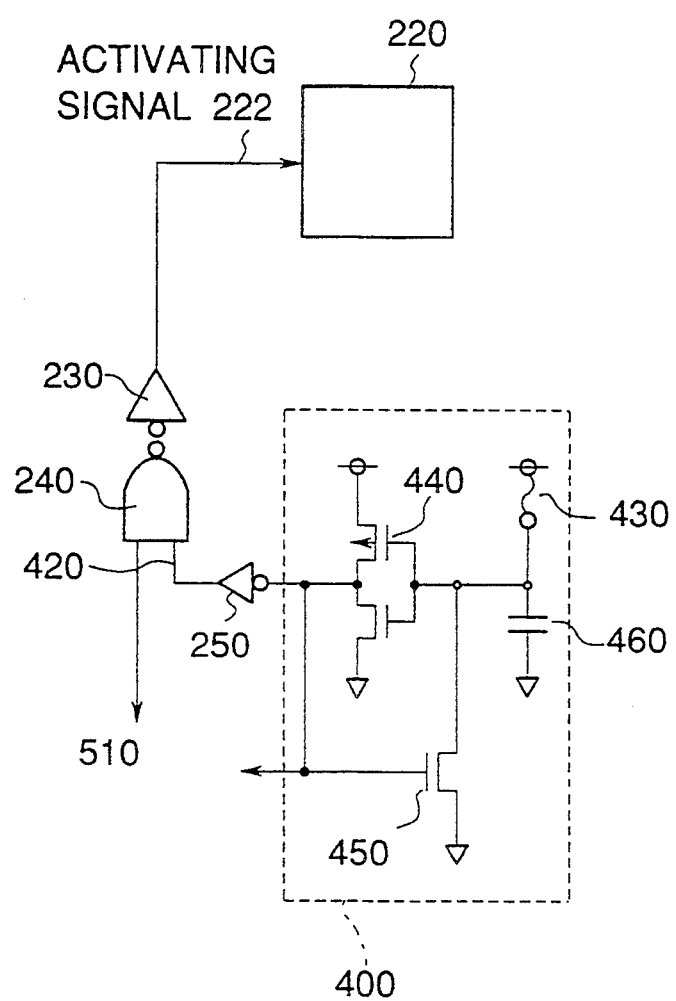
FIG. 6 is a specific structural view which illustrates a fuse programming circuit.

The NAND gate 240 is arranged to receive a signal transmitted from a fuse programming circuit 400 by way of the inverter 250. The NAND gate 240 transmits a signal responding to the logic of each input signal to the pre-sense amplifier 220 by way of the inverter 230. The fuse programming circuit 400, as shown in FIG. 6, comprises a fuse 430 connected to a power source, a capacitor 460, a CMOS inverter 440 and an NMOS transistor 450 as to transmit a low level signal while making a discrimination that the specified unit array of columns for replacing has no defect if the fuse 430 is not interrupted. If the fuse 430 is interrupted, it makes a discrimination that the unit array of columns for replacing has a defect and transmits a high level signal. The low level signal is inverted by the inverter 250 as to be transmitted as a high-level fault free signal. The high-level fault free signal is inverted by the inverter 250 as to be transmitted as a low level fault free signal. That is, the inverter 250 and the fuse programming signal 400 are formed into a fault free discrimination circuit. The NAND gate 240 and the inverter 230 are arranged to serve as a control signal generating circuit which transmits a high level actuation control signal (an actuating signal) to the pre-sense amplifier 220 only when the signal for selecting a unit array of columns for replacing has been supplied in a state where the high level signal (the fault free signal) is being generated by the inverter 250. In the residual cases, that is, in a case where the level of the output signal from the decoder 510 has been lowered or in a case where the level of the output from the inverter 250 has been lowered (that is, in a case where the fault free signal has been generated), the above-described control signal generating circuit transmits a quit control signal. The pre-sense amplifier 220 is formed into a signal transmitting control circuit which responds to the actuation control signal supplied from the inverter 230 to transmit a signal supplied from the data line 341 to a main data output line and responds to the quit control signal to inhibit the transmission of the signal from the data line 341 to the main data output line.

Figure 7:
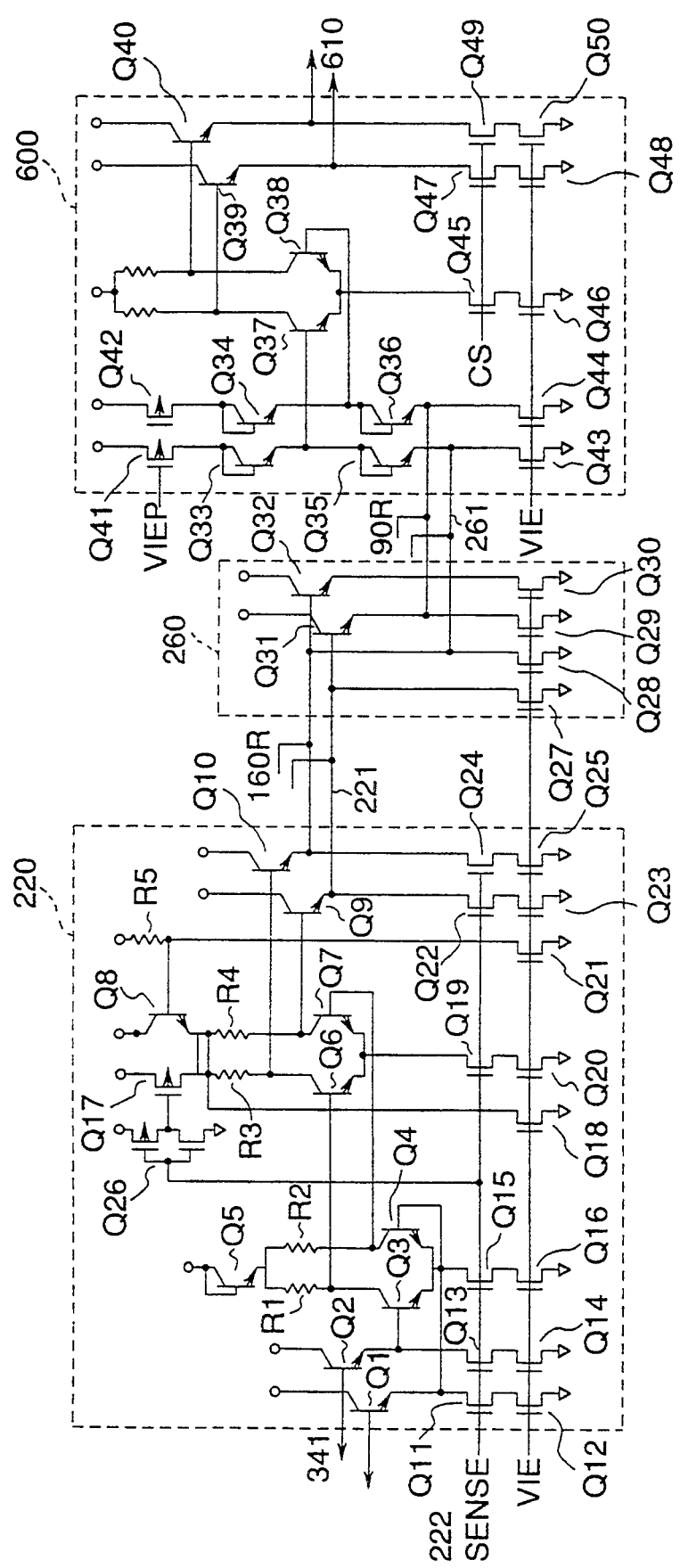
FIG. 7 is a specific circuit diagram which illustrates a pre-sense amplifier and a main sense amplifier.

The pre-sense amplifier 220 specifically comprises bipolar transistors Q1 to Q10, MOS transistors Q11 to Q25, a MOS inverter 26 and resistors R1 to R5, as shown in FIG. 7, the. pre-sense amplifier 220 forming a two-stage bipolar differential amplifying circuit and an emitter follower circuit. Each pre-sense amplifier 220 has the output side formed by the emitter follower circuit. The emitters of the bipolar transistors Q9 and Q10 are wired-or connected to the transistor of the other pre-sense amplifier 220. Further, outputs from 16 pre-sense amplifiers per memory block are wired-Or connected. In the foregoing state, each emitter follower circuit is connected to a load drive circuit 260.

The load drive circuit 260 comprises MOS transistors Q27 to Q30 and bipolar transistors Q31 and Q32 to form an emitter follower circuit. Outputs from 8 load drive circuits 260 and an output from one redundant load drive circuit 360, that is, 9 outputs are connected to one main sense amplifier 600 while being mutually wired-or connected. The main sense amplifier 600 comprises bipolar transistor Q33 to Q40, MOS transistors Q41 to Q50, and resistors R6 and R7 to form a bipolar level shift circuit, a bipolar differential amplifier circuit and an emitter follower circuit.

The decoder 530 is arranged to serve as a main word line selection decoder which receives a block selection signal and a main word selection signal supplied from the address buffer 150 and responds to a specific logic among logics, which are combinations of the foregoing signals, as to transmit a main word line selection command signal to a specific main word driver 350. The foregoing structure includes 128 main word drivers 350. Each of the main word drivers 350 is connected to 8 sub-word drivers 355 while interposing main word lines 351. Each main word driver 350 serves as a main driver circuit which responds to the main word line selection signal supplied from transmitted from the decoder 530 and which transmits a main word line drive signal to the main word line 351. When the main word driver 350 is operated, the main word line drive signals are simultaneously supplied to the 8 sub-word drivers 355.

The decoder 520 serves as a sub-word line selection decoder which receives the block selection signal, the mat selection signal and the row selection signal transmitted from the address buffer 150 and which responds to a specific logic among logics, which are combinations of the foregoing received signals, as to transmit a sub-word line selection command signal to operate the sub-word driver 355. Each sub-word driver 355 serves as a sub-driver circuit which is connected to a memory cell 340 while interposing a sub-word line 356 and which responds to the main word line drive signal supplied from the main word driver 350 and the sub-word line selection command signal supplied from the decoder 520 as to transmit a memory cell drive signal to a specific sub-word line 356. That is, when the main word driver 350 and the sub-word driver 355 are operated in response to the signals supplied from the decoders 520 and 530, the memory cell drive signal is supplied to one sub-word line 356 among the sub-word lines 356 of each unit array 211 of columns for replacing so that access is given to a memory cell, which is connected to the data line 341 that has the column switch which has been switched on. Namely, the decoders 520, 530, the main word driver 350 and the sub-word driver 355 form a word line selection means.

Then, the structure of the second data selection means 720 will specifically be described below.

Figure 8:
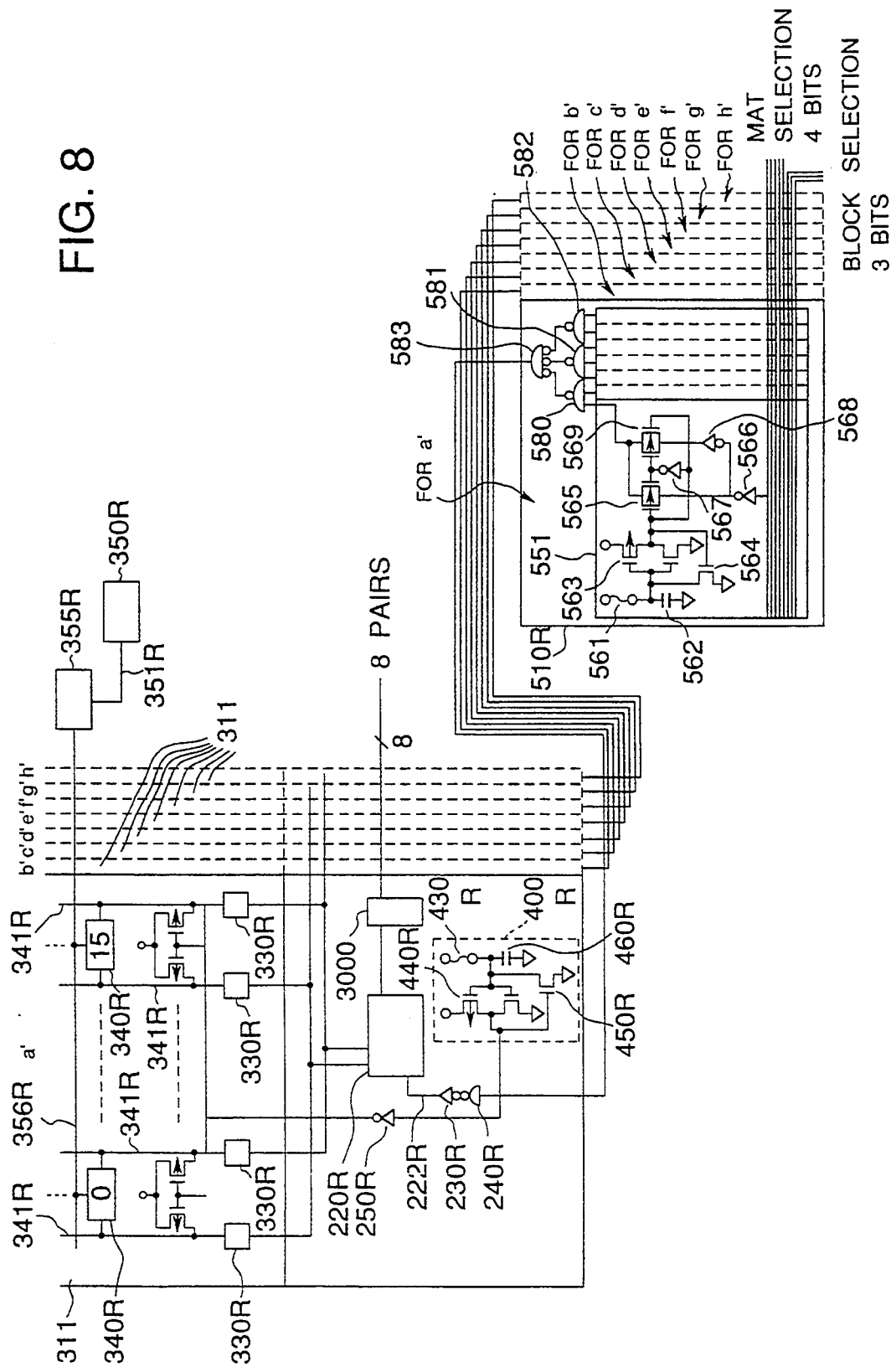
FIG. 8 is a specific structural view which illustrates a unit array of redundant columns.

The second data selection means 720, as shown in FIGS. 3 and 8, decoders 500R, 510R, 520R and 530R, a column switch 330R, a pre-sense amplifier 220R, an inverter 230R, a NAND gate 240R, an inverter 250R, a fuse programming circuit 400R, a main word driver 350R and a sub-word driver 355R.

The decoder 500R comprises a decoder circuit arranged similarly to the decoder 500 and serves as a redundant data line selection decoder which responds to a specific logic among logics which are combinations of the block selection signal, the column selection signal and the mat selection signal to transmit a redundant data line actuating signal to a specific redundant column switch 330R. Each redundant column switch 330R is connected to a pair of redundant data lines 341R to serve as a redundant column switch circuit which responds to a redundant data line actuating signal supplied from the decoder 500R as to transmit a signal supplied from a specific redundant data line 341R to the redundant pre-sense amplifier 225R. That is, the decoder 500R and the redundant column switches 330R form a redundant data line selection means.

The redundant pre-sense amplifier 220R, the inverter 230R, the NAND gate 240R, the inverter 250R and the fuse programming circuit 400R form a data line signal transmission control means. The fuse programming circuit 400R comprises a fuse 430R connected to the power source, a CMOS inverter 440R, a NMOS transistor 450R and a capacitor 460R, the fuse programming circuit 400R serving as an array use discrimination circuit which transmits a low level signal as an array use inhibition signal which inhibits use of the unit array 310 of redundant columns when the fuse 430R is not interrupted. When the fuse 430R is interrupted, the array use discrimination circuit transmits a high level signal as an array use command signal with which use of a unit array 311 among the unit array 310 of redundant columns is commanded. The inverter 230R and the NAND gate 240R form a redundant control signal generating circuit which responds to a signal for selecting a unit array of redundant columns only under condition that the fuse 430R has been interrupted and therefore the high level array use command signal has been generated by the fuse programming circuit 400R as to transmit an activation control signal (activation signal) 220R, the redundant control signal generating circuit being arranged to transmit a turning off signal in the residual cases. The foregoing structure includes 8 redundant pre-sense amplifiers 220R corresponding to the unit arrays 311 of redundant columns in such a manner that the input side of each redundant pre-sense amplifier 220R is connected to the redundant column switch 330R and the output side of the same is connected to an I/O selection circuit 3000. The redundant pre-sense amplifier 220R serves as a redundant signal transmission control circuit which responds to the activation control signal (the activation signal) 220R supplied from the inverter 230R as to transmit a signal supplied to the redundant data line 341R to the redundant data output line and responds to a turning off signal supplied from the inverter 230R to inhibit transmission of the signal transmitted from the redundant data line 341R to the redundant data output line. That is, the redundant pre-sense amplifier 220R responds to the signal for selecting the unit array of redundant columns supplied from the decoder 510R only when the fuse 430R is interrupted as to transmit a signal supplied from a specific redundant data line 341R to the I/O selection circuit 3000.

Figure 9:
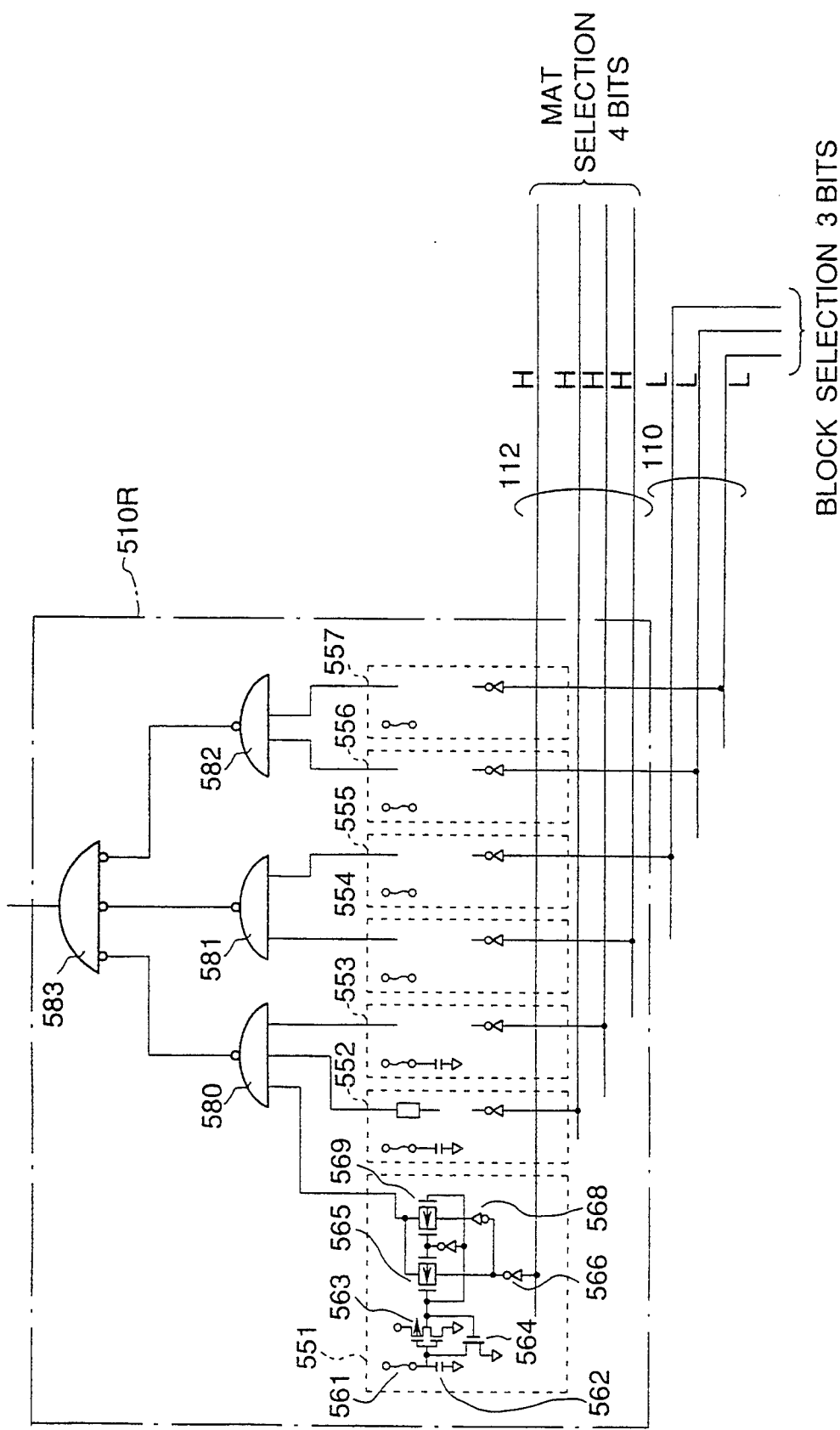
FIG. 9 is a specific circuit diagram which illustrates a redundant column replacement unit array selection decoder.

The foregoing structure includes 8 decoders 510R to correspond to the unit arrays 311 of redundant columns, the decoder 510R serving as the means for generating the signal for selecting unit array 311 of redundant columns. Each decoder 510R, as shown in FIG. 9, comprises 8 fuse switch circuits 551 to 557, NAND gates 580 to 582 and a NOR gate 583. Each of the fuse switch circuits 551 to 557 are connected to signal lines 110 and 112, while the NOR gate 583 is connected to the NAND gate 240R. Each of the fuse switch circuits 551 to 557 comprises a fuse 561, a capacitor 562, a CMOS converter 563, an NMOS transistor 564, a transfer MOS transistor 565, inverters 566, 567 and 568 and a transfer MOS transistor 569. When the fuse 561 is not interrupted, the level of the output from the inverter 563 is lowered, causing the transistor 565 to be turned off and the transistor 569 to be turned on. If a high level signal is supplied to the inverter 566 at this time, a signal inverted by the inverter 566 is again inverted by the inverter 568. As a result, a high level signal is transmitted by way of the transistor 569. If a low level is supplied to the inverter 566 at this time, a low level signal is transmitted by way of the transistor 569.

If the fuse 561 is interrupted, the output from the inverter 563 is inverted to a high level and the output from the inverter 567 is inverted to a low level. As a result, the transistor 565 is turned on and the transistor 569 is turned off. If the high level signal is supplied to the input terminal of the inverter 566 at this time, the low level signal inverted by the inverter 566 is transmitted by way of the transistor 565. If a low level signal is supplied to the inverter, the signal is inverted and therefore a high level signal is transmitted from the transistor 565. That is, the fuse switch circuits 551 to 557 are formed into gate circuits which receive any logical signal included in a logical signal group formed by combining the block selection signals generated from the address signal and the mat selection signals as to transmit the supplied logical signal as it is if the fuse 561 has not been interrupted. If the fuse 561 has been interrupted, the gate circuits invert the logic of the supplied logical signal as to transmit the same.

The NAND gates 580 to 582 and the NOR gate 583 are formed into redundant array selection decoders, which receive logical signals supplied from the fuse switch circuits 551 to 557 and which respond to a specific logic among logics which are combinations of the logical signal groups, as to generate a signal for selecting a unit array of columns for replacing. The NAND gates 580 to 582 and the NOR gate 583 transmit a high level signal for selecting a unit array of columns for replacing through the NOR gate 583 only when the levels of the outputs from the fuse switch circuits 551 to 557 have been raised. In the residual cases, they transmit a low level signal. That is, the decoder 510R is caused to correspond to the block and mat having the defective unit array 211 of columns for replacing in accordance with a logic when any fuse 561 of the fuse switch circuits 551 to 557 has been interrupted.

An example case will now be considered in which the four bits of the mat selection signals are "H", "L", "L" and "L" and the three bits of the block selection signal are "L", "L" and "L". An assumption is made about a case where a column of the unit array 211 of columns for replacing in a specific mat in a block specified with the foregoing address is defective while giving #b to the unit array 211 of columns for replacing which has the defective column as to replace the #b array by a #a' unit array 311 of redundant columns.

By making the fuse 561 of each of the fuse switch circuits 551 to 557 to be conductive, the level of only the output from the fuse switch circuit 551 is raised when the mat selection signal and the block selection signal for specifying the #b unit array 211 of columns for replacing have been supplied to the fuse switch circuits 551 to 557. The levels of the outputs from the residual fuse switch circuits are lowered. Since levels of all outputs from the NAND gates 580 to 582 have been raised in the foregoing state, the NOR gate 583 transmits a low level signal. In a state where the NOR gate 583 transmits a low level signal, the signal for selecting a unit array of columns for replacing is not transmitted and the redundant pre-sense amplifier 220R is turned off.

In order to raise the level of the activating signal to turn on the redundant pre-sense amplifier 220R, the input levels of all NOR gates 583 must be lowered. That is, the input levels of all NAND gates 581 to 582 must be raised.

Therefore, the fuses 561 of all fuse switch circuits 552 to 557, to which the low level mat selection signals and block selection signals have been supplied, are interrupted. When the fuses 561 have been interrupted, the transistor 565 is turned on and the transistor 569 is turned off. As a result, signals, the logic of each of which has been inverted, are transmitted so that high level signals are supplied to all NAND gates 580 to 582.

When all NAND gates 580 to 582 receive high level signals, the output from the NOR gate 583 is inverted from the low level to the high level. As a result, the NOR gate 583 transmits a high level signal for selecting a unit array of columns for replacing so that the block and the mat having the defective column and the #a' unit array 311 of redundant columns can be made correspond to one another. It should be noted that the fuse 430R of the fuse programming circuit 400R must be interrupted in the foregoing state. The process for making correspond the #b unit array of columns for replacing and the #a' unit array of redundant columns to each other will be described in detail when the third data selection means 730 will be described.

The decoder 530R is formed into a redundant main word line selection decoder for receiving the block selection signal and the main word selection signal from the address buffer 150 and responding to a specific logic among logics, which are combinations of the input signals, as to transmit a redundant main word line selection signal to a specific redundant main word driver 450R. Each redundant main word driver 350R is, by way of the redundant main word line 351R, connected to the redundant sub-word driver 355R. Each redundant main word driver 350R is formed into a redundant main driver circuit which responds to the redundant main word line selection command signal supplied from the decoder 530R to transmit the redundant main word line drive signal to a specific redundant main word line.

The decoder 520R is formed into a redundant sub-word line selection decoder which receives the block selection signal, the mat selection signal and the row selection signal supplied from the address buffer 150 and which responds to a specific logic among logics which are combinations of the foregoing input signals as to transmit the signal for selecting the redundant sub-word line selection command signal. Each redundant sub-word driver 355R is formed into a redundant sub-driver circuit which is connected to the redundant sub-word line 356R and which responds to the redundant sub-word line selection command signal supplied from the decoder 520R as to transmit a memory cell drive signal to a specified redundant sub-word line 356R. When the specified redundant sub-word line 356R and the redundant data line are selected and therefore access is given to the specific redundant memory cell, a signal supplied from the redundant data line 341R connected to the foregoing redundant memory cell is transmitted to the redundant pre-sense amplifier 220R. When the redundant pre-sense amplifier 220R has been turned on at this time in response to the signals supplied from the decoder 510R and the fuse switch circuit 400R, a signal supplied from the redundant data line 341R is transmitted to the I/O line selection circuit 3000. That is, the decoders 520R, 530R, the redundant main word driver 350R and the redundant sub-word driver 355R are formed into a redundant word line selection means.

Then, the specific structure of the third data selection means 730 will now be described.

The third data selection means 730 comprises the I/O selection circuit 3000 and a plurality of redundant load drive circuit 360 for each redundant memory block 310, each redundant load drive circuit 360 being connected to a common emitter line (a main data output line) 261. The third data selection means 730 is formed into a data output line selection means for connecting the redundant data output line 341R, which is connected to an arbitrary array 311 of the unit array 311 of redundant columns, to a specified common emitter line 261. That is, the third data selection means 730 is disposed for the purpose of making correspond the arbitrary unit array 211 among the unit arrays 211 of columns for replacing and the arbitrary unit array 311 of redundant columns to each other. Then, the specific circuit structure will now be described.

Figure 10:
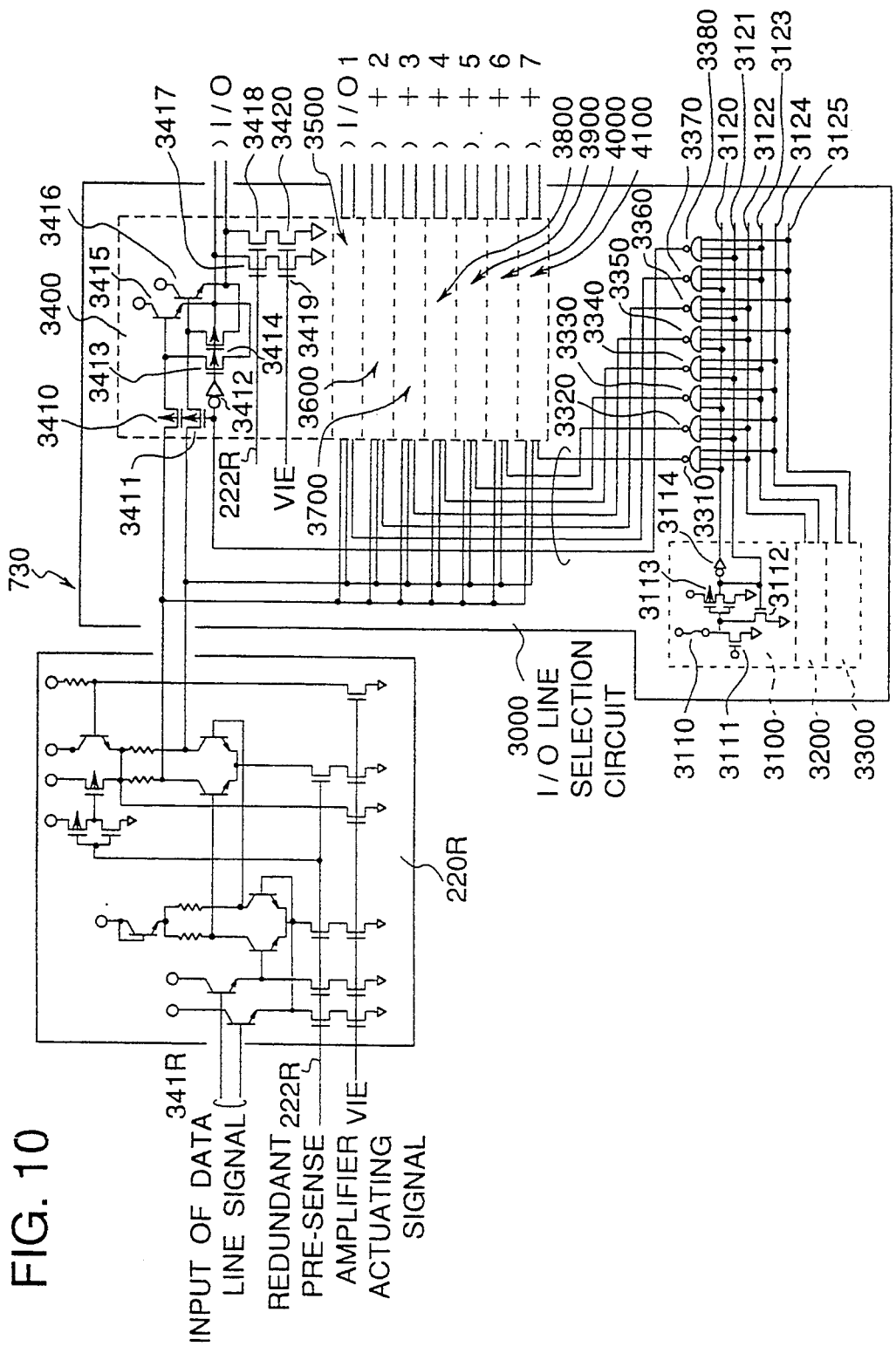
FIG. 10 is a specific circuit diagram which illustrates an I/O line selection circuit.

The I/O line selection circuit 3000, as shown in FIG. 10, comprises three fuse program circuits 3100, 3200 and 3300, eight 3-input NAND gates 3310 to 3380 and eight I/O line drive circuits 3400 and 4100. The input side of each I/O line drive circuit is connected to a collector follower circuit of the redundant pre-sense amplifier 220R, while the output side of the same is connected to the redundant load drive circuit 360.

Each of the fuse program circuit 3100 to 3300 is connected to a fuse 3110 connected to the power source, NMOS transistors 3111 and 3112, a CMOS inverter 3113 and an inverter 3114. When the fuse 3110 is not interrupted, the fuse program circuits 3100 to 3300 transmit high level signals to signal lines 3120, 3122 and 3124 and low level signals to signal lines 3121, 3123 and 3125. When the fuse 3110 is interrupted, the fuse program circuit 3100 to 3300 transmit the foregoing signals, the logic of each of which has been inverted, to the corresponding signal lines. The output signals from the fuse program circuits 3100 to 3300 are, by way of the 3-input NAND gates 3310 to 3380, supplied to the I/O line drive circuits 3400 to 4100.

Each of the I/O line drive circuits 3400 to 4100 comprises PMOS transistors 3410 and 3411, an inverter 3412, PMOS transistors 3413 and 3414 for short circuit, bipolar transistors 3415 and 3416 forming the emitter follower circuit, switching NMOS transistors 3417 and 3418, and NMOS transistors 3419 and 3420 forming a constant current source. The transistors 3410 and 3411 are turned off when the gate voltage is high level, while the same is turned on when the gate voltage is low level. As a result, the signal from the redundant pre-sense amplifier 220R is transmitted to each of the bipolar transistors 3415 and 3416. When the gate voltage level is low, the transistor 3413 short-circuits between the base and the emitter of the transistor 3415. When the gate voltage level is high, the transistor 3413 is turned off. When the gate voltage level is low, the transistor 3414 short-circuits between the base and the emitter of the transistor 3416. When the gate voltage level has been inverted to a high level, the transistor 3414 is turned off. Each of the transistors 3417 and 3418 is turned on in response to the activating signal 222R. The transistors 3419 and 3420 are turned on with a predetermined voltage level VIE in a state where the chip has been turned on.

Then, the process of making correspond the #b unit array 211 of columns for replacing and the #a' unit array 311 of redundant columns to each other will now be described.

When all fuses 3110 of the fuse program circuits 3100 to 3300 are in a conductive state,. "H", "L", "H", "L", "H" and "L" signals are sequentially transmitted from the fuse program circuits 3100 to 3300. Therefore, the level of only the output from the 3-input NAND gate 3310 is lowered, while the levels of the outputs from the residual NAND gates 3320 to 3380 are raised. When the levels of the outputs from the NAND gates 3320 to 3380 have been raised, the transistors 3413 and 3414 are turned on and the transistors 3410 and 3411 are turned off. As a result, the signal lines of the I/O line drive circuits 3400 to 4000 are interrupted.

If the level of the output from the NAND gate 3310 has been lowered on the contrary, the transistors 3410 and 3411 are turned on and the transistors 3413 and 3414 are turned off. Therefore, a signal supplied from the redundant pre-sense amplifier 220R is transmitted through the I/O line drive circuit 4100. That is, the I/O line drive circuit 4100 connected to a #h unit array 211 of columns for replacing is selected.

However, the #b unit array 211 of columns for replacing must be redundant-replaced. Moreover, an assumption is made that the #b unit array 211 of columns for replacing is connected to the I/O line drive circuit 3500 at the foregoing moment.

In order to connect the output from the redundant pre-sense amplifier 220R, which is connected to the #a' unit array 311 of redundant columns, to the #b unit array 211 of columns for replacing by way of the I/O line drive circuit 3500, the fuses 3110 of the fuse program circuits 3200 and 3300 are interrupted.

When the fuse 3110 has been interrupted, the logic of the output from each of the fuse program circuits 3200 and 3300 is inverted. As a result, "H", "L", "L," "H", "L" and "H" level signals are transmitted from the fuse program circuits 3100 to 3300. As a result, only the level of the outputs from the NAND gate 3370 is lowered, while the levels of the outputs from the residual NAND gates are raised. Therefore, only the I/O line drive circuit among the I/O line drive circuits is turned on so that a signal transmitted from the redundant pre-sense amplifier 220R is transmitted by way of the I/O line drive circuit 3500.

As a result of the foregoing process, the #a' unit array 311 of redundant columns and the #b unit array 211 of columns for replacing are made correspond to each other.

As described above, this embodiment is arranged in such a manner that, if a column in the memory mat 210 in a certain memory block 200 has become defective, for example, if #b, #c, #d and #g arrays among the unit arrays 211 of columns for replacing in the #15 memory mat 210 have become defective, the blocks and the mats having the defective columns and the unit array 211 of columns for replacing are made correspond to each other. Further, the blocks and the mats having the defective columns and, for example, #a', #b', #c' and #d' arrays among the unit arrays 311 of redundant columns and, for example, #b, #c, #d and #g arrays among the unit arrays 211 of columns for replacing are made correspond to one another. As a result, the b, c, d and g unit arrays 211 of columns for replacing can be replaced by a', b', c' and d' unit arrays 311 of redundant columns. In this case, when access has been given to each of the b, c, d and g unit arrays 211 of columns for replacing, data outputs from the foregoing unit arrays are inhibited. As an alternative to this, data is transmitted from the a', b', c' and d' unit arrays 311 of redundant columns.

If any one of the memory mats 210 in the memory block 200 has encountered column defect due to a defect of a data line, the unit array 211 of columns for replacing having the defective column can be made correspond to an arbitrary unit array 311 of redundant columns. Therefore, concentric generation of column defects in a specific memory block 200 can be replaced, and therefore the replacement can further freely be performed.

It should be noted that the redundant row array 420 can be subjected to the replacement similarly to the conventional method in such a manner that the defective row is replaced in a 2 megabit memory block 200.

In order to replace a defective column in the memory mat 210, a method may be employed in which a selection inhibit signal is supplied into the logic for selecting the column. However, employment of the foregoing method arises a necessity of supplying the column selection inhibit signal into the logic for selecting the block and the mat. Therefore, an undesirable delay takes place in order to select the column. Accordingly, this embodiment employs a method in place of generating the selection inhibition signal for inhibiting the selection of the defective column, the employed method comprising the steps of turning off the pre-sense amplifier 220, and turning on the redundant pre-sense amplifier 220R. Therefore, the generation of delay for selecting the column can be prevented.

The foregoing third embodiment is arranged in such a manner that the two redundant-only memory blocks 310 are used to replace the unit array 211 of columns for replacing in an arbitrary memory block 200. Then, another replacing method will now be described with reference to FIGS. 11 to 14.

Figure 11:
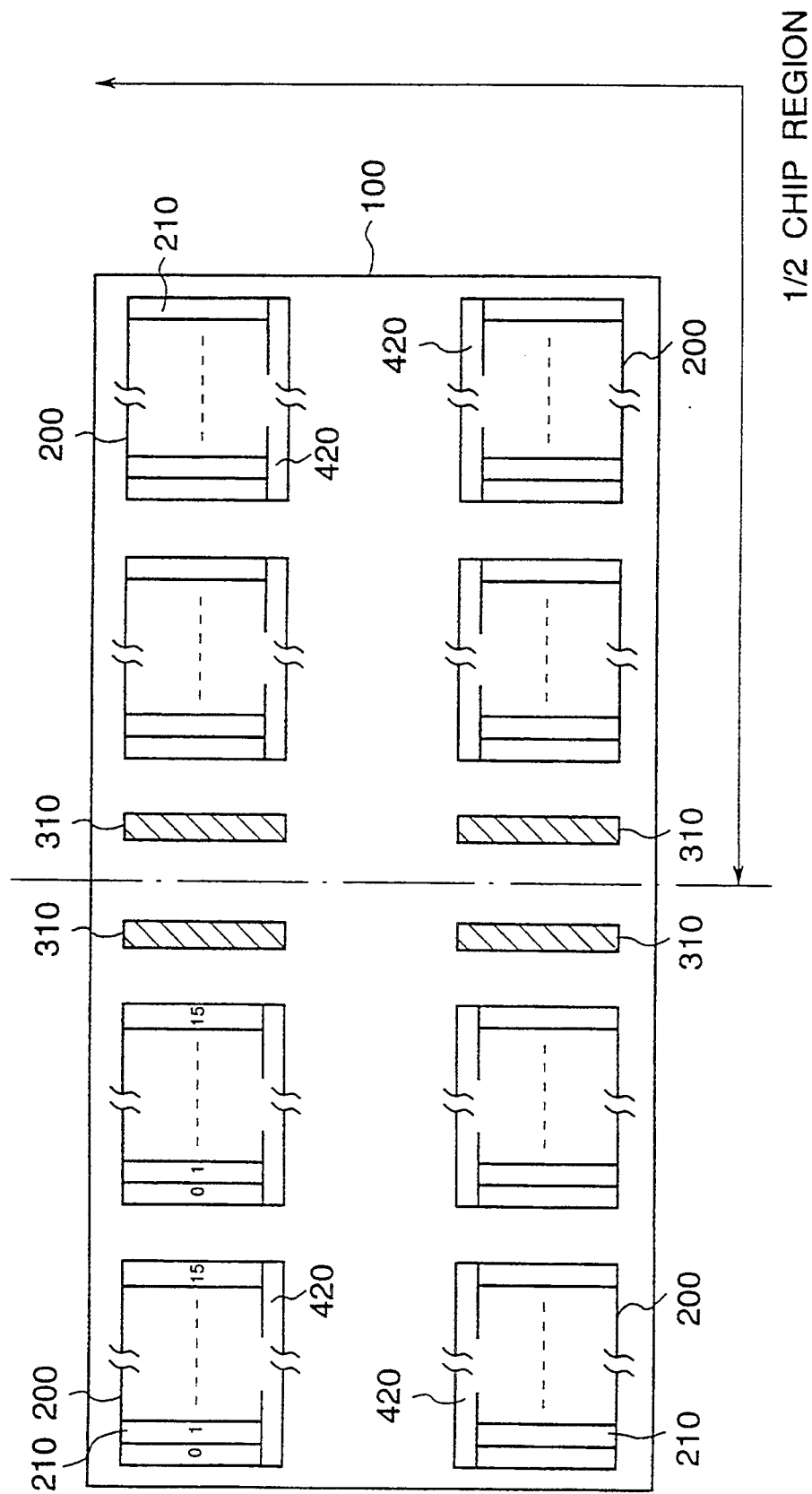
FIG. 11 is a block diagram which illustrates the structure of a second embodiment of the present invention.

FIG. 11 illustrates a second embodiment of the present invention, wherein 8 memory blocks 200 and 4 redundant memory blocks 310 are disposed on the chip 100. This embodiment is arranged in such a manner that the region on the chip 100 is laterally divided into two sections so that the two unit arrays 311 of redundant columns disposed vertically are used to replace the unit array 211 of columns for replacing in the four memory blocks 200.

Figure 12:
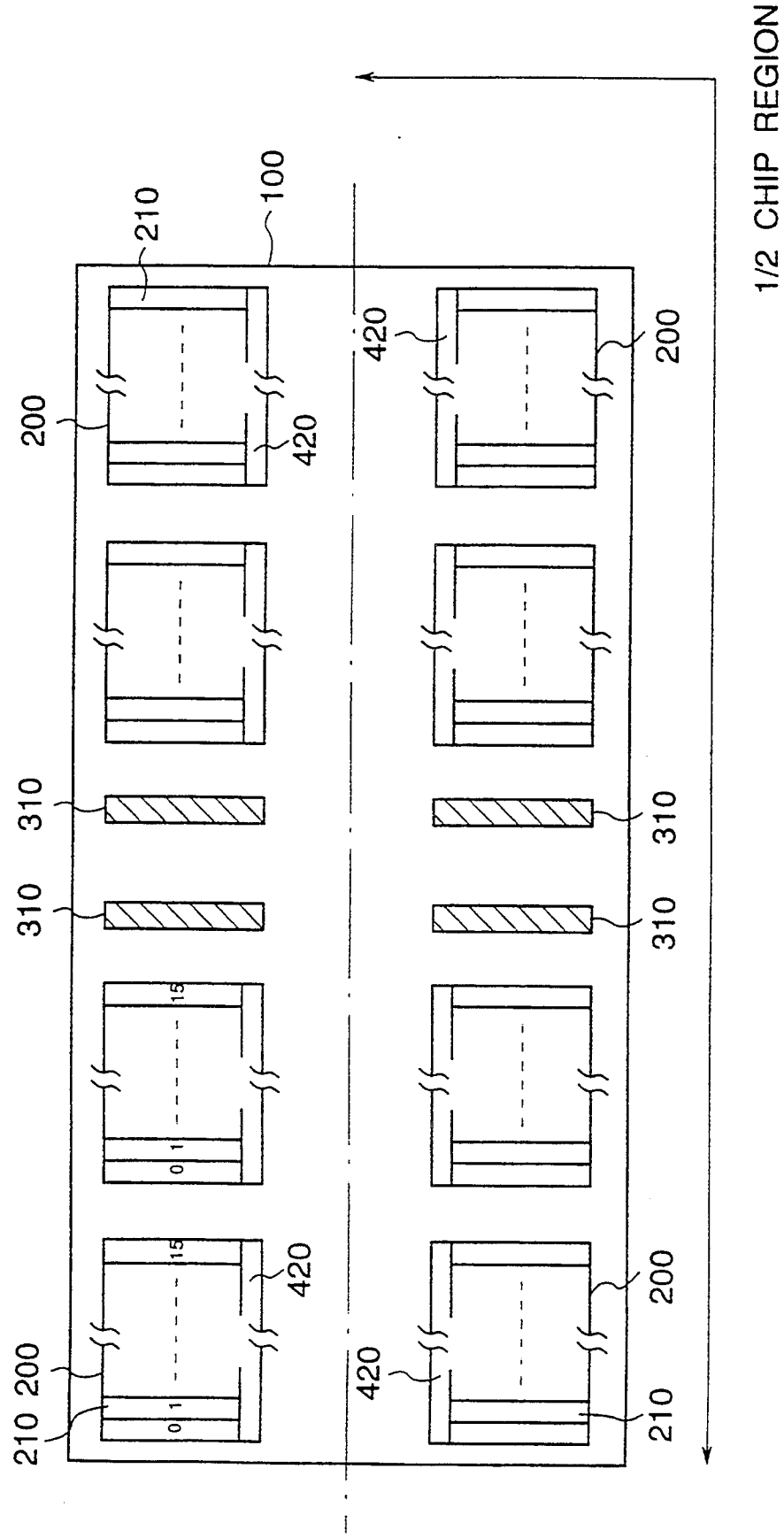
FIG. 12 is a block diagram which illustrates the structure of a third embodiment of the present invention.

FIG. 12 illustrates a third embodiment of the present invention, wherein 8 memory blocks 200 and 4 redundant memory blocks 310 are disposed on the chip 100. In this embodiment, the memory on the chip 100 is vertically divided into two sections, the two redundant-only memory blocks 310 disposed in the upper portion are used to replace the unit arrays 211 of columns for replacing in the four memory blocks 200 disposed in the upper portion, and the two redundant-only memory blocks 310 disposed in the lower portion are used to replace the unit arrays 211 of columns for replacing in the four memory blocks 200 disposed in the lower portion.

Figure 13:
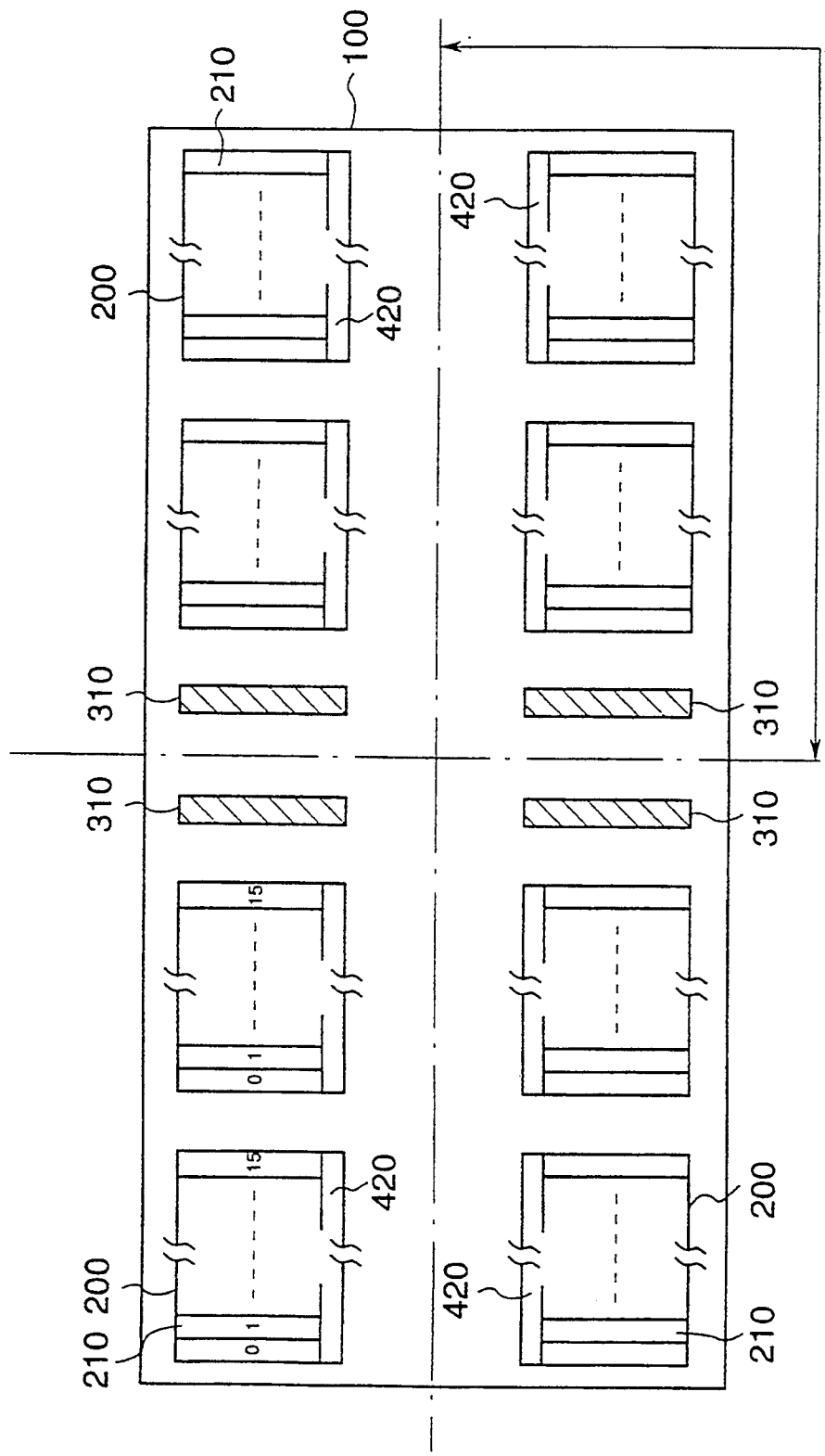
FIG. 13 is a block diagram which illustrates the structure of a fourth embodiment of the present invention.

FIG. 13 illustrates a fourth embodiment of the present invention, wherein 8 memory blocks 200 and 4 redundant memory blocks 310 are disposed on the chip 100. In this embodiment, the memory on the chip 100 is divided into four blocks. That is, each redundant-only memory block 310 is used to replace the unit arrays 211 of columns for replacing in the two memory blocks 200.

Figure 14:
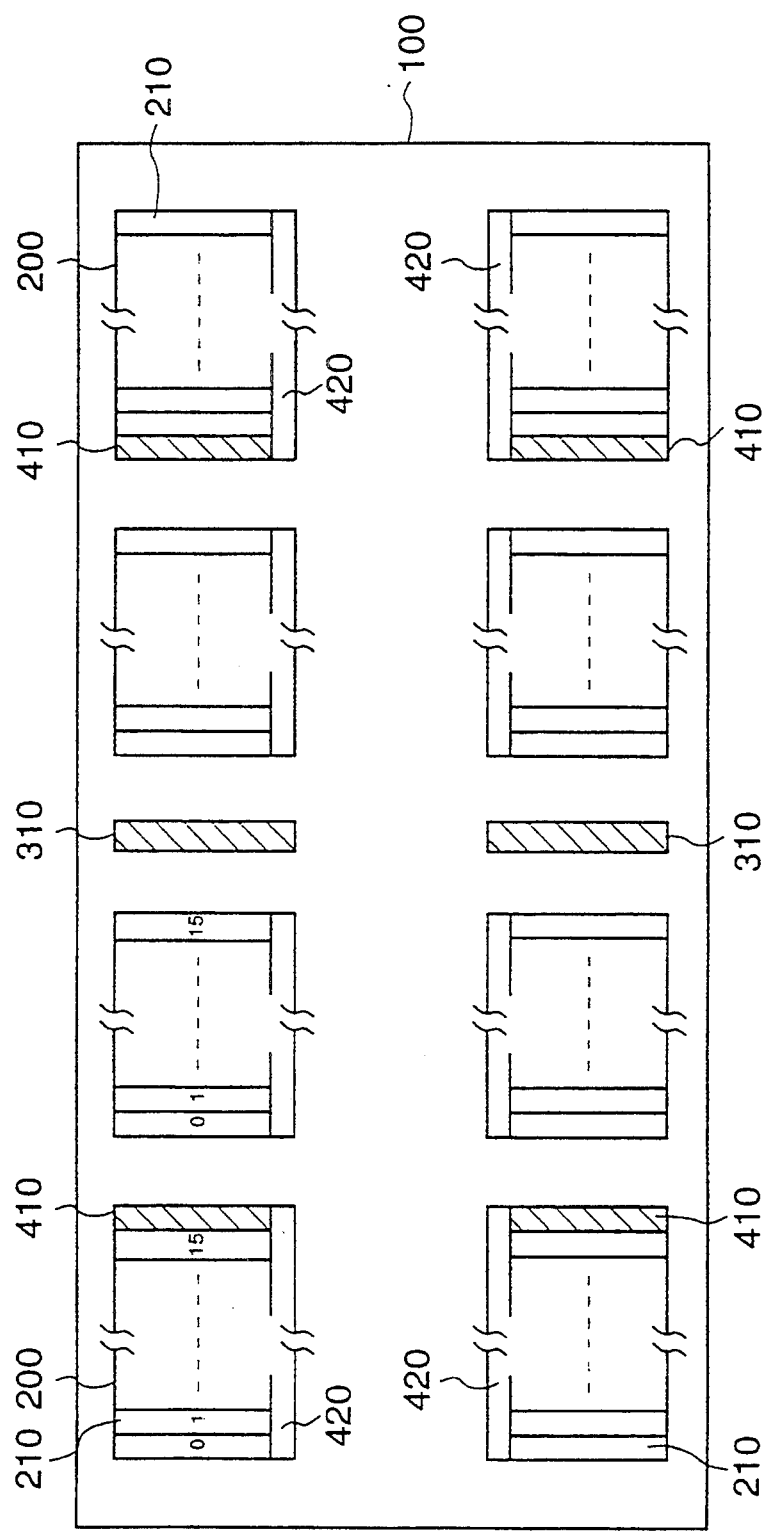
FIG. 14 is a block diagram which illustrates the structure of a fifth embodiment of the present invention.

FIG. 14 illustrates a fifth embodiment of the present invention, wherein 8 memory blocks are disposed on the chip 100 and 2 redundant memory blocks 310 are disposed on the same. In this embodiment, the two redundant memory blocks 310 are used to replace the unit arrays 211 of columns for replacing in an arbitrary memory block 200, and a redundant column array 410 is disposed in an adequate memory block 200 so that the redundant column array 410 is used to replace each memory block 200.

Figure 15:
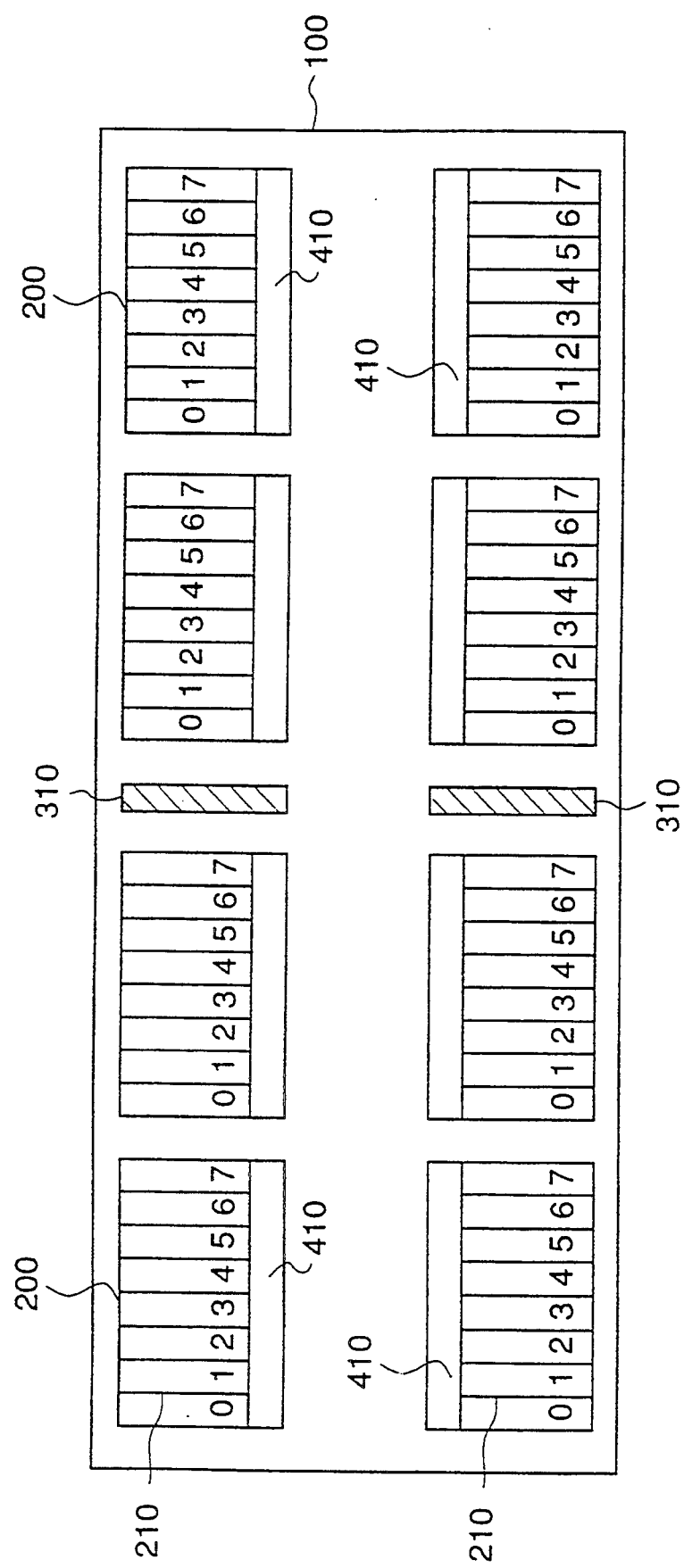
FIG. 15 is a block diagram which illustrates the structure of a sixth embodiment of the present invention.
Figure 16A:
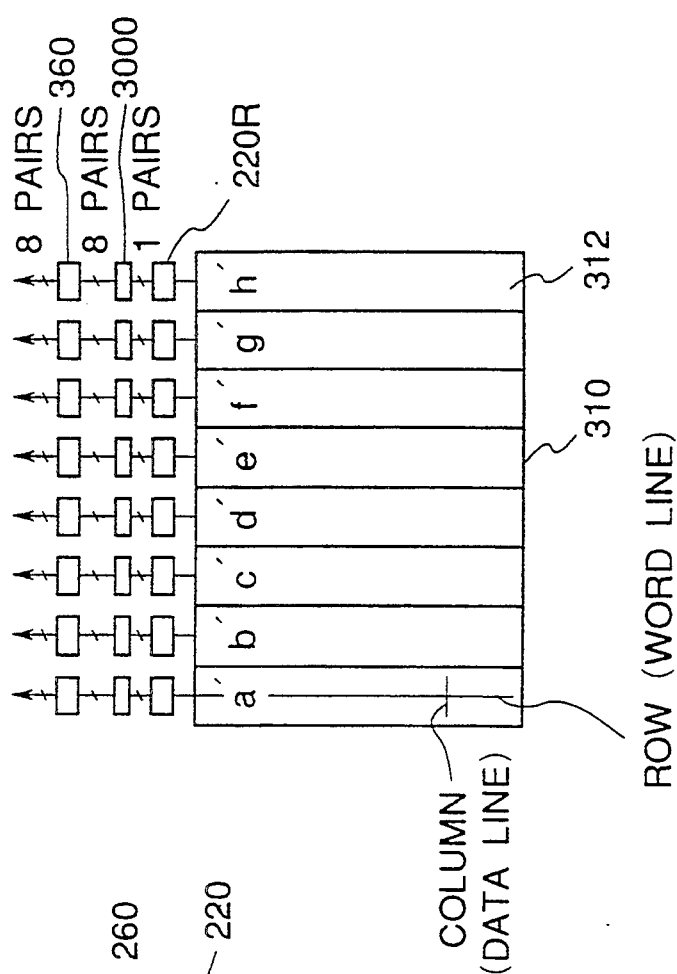
FIG. 16(a) and 16(b) are structural views which illustrate unit arrays of rows for replacing and a unit array of redundant rows.
Figure 16B:
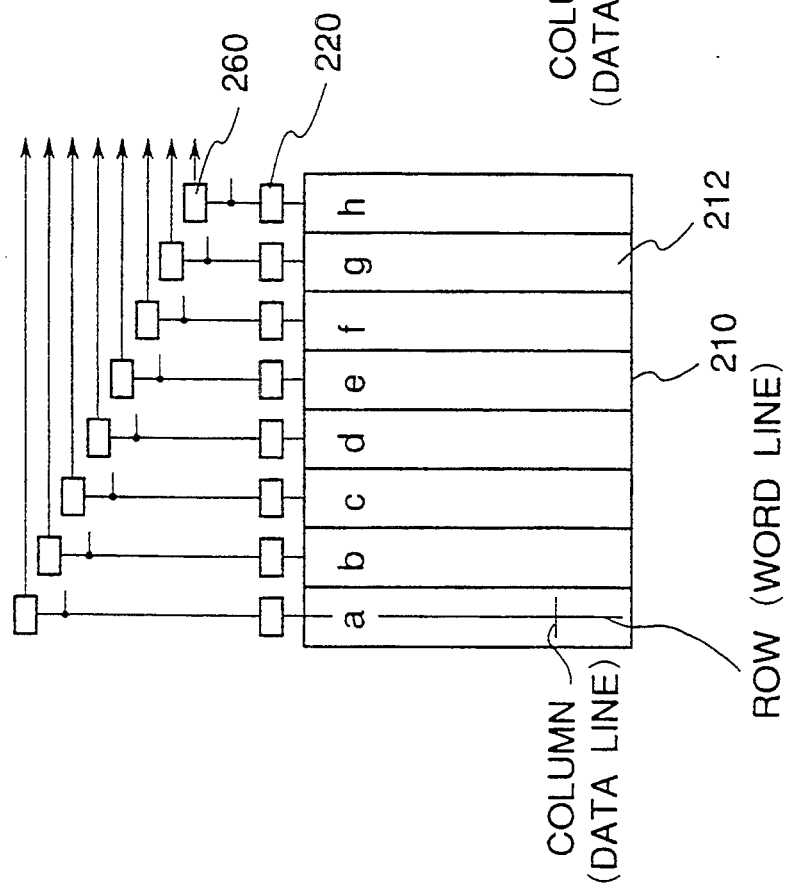
Figure 17:
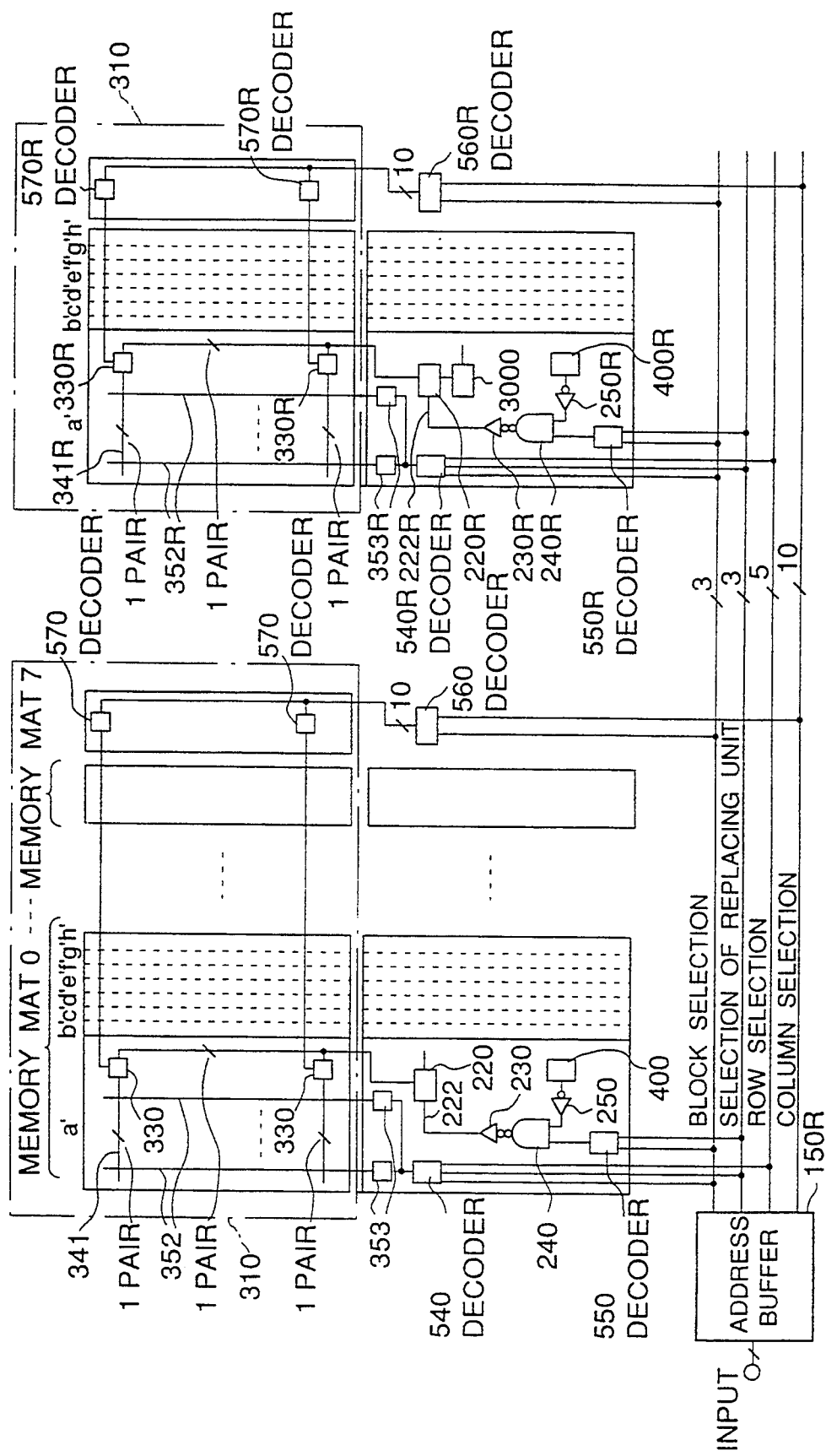
FIG. 17 is a circuit diagram which illustrates a sixth embodiment of the present invention.

A sixth embodiment of the present invention will now be described with reference to FIGS. 15 to 17.

This embodiment employs a row replacing method as the redundant replacing method. Eight memory blocks 200 and redundant memory blocks 310 are disposed on the chip 100. Each memory block 200 is divided into 8 memory mats 210. Each memory mat 210 comprises a plurality of memory cell lines commonly having a data line 341, and each memory mat includes a word lines 351 simultaneously activated with respect to one address. In addition, each memory mat 210 is divided into 8 unit arrays 211 of columns for replacing. Further, each unit array 211 of columns for replacing has the pre-sense amplifier 220 therein, each pre-sense amplifier 220 being connected to the load drive circuit 260.

On the other hand, the redundant-only memory block 310 has 8 unit arrays 312 of redundant rows. Each of the unit arrays 312 of redundant rows is connected to the I/O line selection circuit 3000 by way of the redundant pre-sense amplifier 220R.

The semiconductor memory according to this embodiment is arranged similarly to the first embodiment in such a manner that the first data selection means selects data in the memory block, the second data selection means selects data in the redundant memory block 310 and either data of data selected by the first data selection means or the data selected by the second data selection means is selected by the third data selection means as to be transmitted to the output buffer 610 by way of the pre-sense amplifier 600. Then, the specific structure of this embodiment will now be described.

The first data selection means comprises a word line selection means, a data line selection means, a means for generating a signal for selecting a unit array of rows for replacing, and a means for controlling transference of data line signals. The word line selection means comprises a decoder 540 and a word driver 353. The decoder 540 is formed into a word line selection decoder which responds to a specific logic among logics which are combinations of the block selection signal, a redundant unit selection signal and a row selection signal as to transmit a word line activating signal. The word driver 353 is formed into a driver circuit which responds to the word line activating signal supplied from the decoder 540 as to transmit a memory cell drive signal to a selected word line 352.

The data line selection means comprises the column switch 330 and the decoders 560 and 570. Each column switch 330 is connected to the data line 341, and each decoder 570 is connected to the column switch 330. The decoder 560 responds to a specific logic among logics which are combinations of the block selection signals and the column selection signals generated from the address signal as the data line selection signals as to operate a selected decoder 570. The decoder 570 responds to a signal supplied from the decoder 560 as to transmit a data line activating signal to a selected column switch 330. That is, the decoders 560 and 570 are formed into data line selection decoders. Each column switch 330 is formed into a column switch circuit which is turned on in response to a data line activating signal supplied from the decoder 570 as to transmit a signal supplied from the data line 341 to the pre-sense amplifier 220.

The means for generating a signal for selecting a unit array of rows for replacing comprises a decoder 550. The decoder 550 is formed into an array selection decoder which responds to a specific logic among logics which are combinations of the block selection signals and the signal for selecting units for replacing which have been generated from the address signal as to generate a signal for selecting a unit array of rows for replacing.

The means for controlling transference of data line signals, similarly to the first embodiment, comprises a pre-sense amplifier 220, an inverter 230, a NAND gate 240, an inverter 250 and a fuse program circuit 400. That is, when the fuse in the fuse program circuit 400 is not interrupted, a discrimination is made that no defect has taken place with the unit arrays 212 of redundant rows, and the pre-sense amplifier 220 is turned on in response to the signal for selecting a unit array of rows for replacing. As a result, a signal supplied from the data line 341 is transmitted by way of the pre-sense amplifier 220. If the fuse in the fuse program circuit 400 has been interrupted, a discrimination is made that the unit arrays 212 of redundant rows have encountered a defect and therefore the pre-sense amplifier 220 is turned off always. As a result, even if the column switch of a selected data line 341 has been turned on, the signal output from the data line is inhibited.

The second data selection means comprises a redundant word line selection means, a redundant data line selection means, a means for generating a signal for selecting a unit array of rows for replacing and a redundant data line signal transfer control means.

The redundant word line selection means comprises a decoder 540R and a word driver 353R. The decoder 540R is formed into a redundant word line selection decoder which responds to a specific logic among logics which are combinations of the block selection signals, the replacing unit selection signals and the row selection signals generated as the redundant word line selection signals as to transmit a redundant word line activating signal for operating a selected word driver 353R. Each word driver 353R is formed into a redundant driver circuit which responds to the redundant word line activating signal supplied from the decoder 540R as to transmit a memory cell drive signal to a selected redundant word line 352R.

The redundant word line selection means comprises the redundant column switch 330R and the decoders 560R and 570R. Each redundant column switch 330R is connected to the redundant data line 341R, while each decoder 570R is connected to the redundant column switch 330R. The decoder 560R responds to a specific logic among logics which are combinations of the block selection signals and the column selection signals generated from the address signal as the redundant data line selection signal as to operate a selected decoder 570R. Each decoder 570R responds to a specific signal among signals supplied from the decoder 560R as to transmit a redundant data line activating signal to the redundant column switch 330R. That is, the decoders 560R and 570R are formed into redundant data line selection decoders. Each redundant column switch 330R is formed into a redundant column switch circuit which is switched on in response to the redundant data line activating signal supplied from the decoder 570R as to transmit a signal supplied from the redundant data line 341R to the redundant pre-sense amplifier 220R.

The means for generating the signal for selecting a unit array of rows for replacing comprises a decoder 550R. The decoder 550R responds to a specific logic among logics which are combinations of the block selection signals and the replacement unit selection signals generated from the address signal as to transmit a signal for selecting a unit array of rows for replacing. That is, the decoder 550R comprises: a plurality of fuses disposed to correspond to signal lines of a logical signal groups which are combinations of the block selection signals and the replacement selection signals; a plurality of gate circuits which receive any one of logical signals among the logical signal groups which are combinations of the block selection signals and the replacement selection signals as to transmit the supplied logical signal as it is if the fuse has not been interrupted and inverts the logic of the supplied logical signal if the fuse has been interrupted before it is transmitted; and a redundant array selection decoder which receives the logical signal from each gate circuit and which responds to a specific logic among logics which are combinations of the logical signal groups as to transmit a high level signal as the signal for selecting a unit array of rows for replacing.

The means for controlling the transfer of the redundant data line signal, similarly to the first embodiment, comprises the redundant pre-sense amplifier 220R, the inverter 230R, the NAND gate 240R, the inverter 250R and the fuse program circuit 400R. That is, if the fuse in the fuse program circuit 400R is not interrupted, use of the unit arrays 312 of redundant rows is inhibited by always turning off the redundant pre-sense amplifier 220R even if the signal for selecting a unit array of rows for replacing has been transmitted. If the fuse has been interrupted, the unit arrays 312 of redundant rows are used by turning on the redundant pre-sense amplifier 220R in response to the signal for selecting a unit array of rows for replacing so that the signal supplied from the redundant data line 341R is transmitted to the I/O line selection circuit 3000. In this case, the fuse program circuit 400R forms an array use discrimination circuit, the inverter 230R and the NAND gate 240R form a redundant control signal generating circuit and the redundant pre-sense amplifier 220R forms a redundant signal transfer control circuit.

The third data selection means, similarly to the first embodiment, comprises the I/O line selection circuit 3000 shown in FIG. 10. Since the specific structure of the third data selection means has been described above, it is omitted from description here.

Similarly to the first embodiment, this embodiment enables the unit arrays 212 for replacing, which has encountered a defect, to be replaced by the unit arrays 312 of redundant rows even if the low of any one of the memory blocks 200 has encountered the defect. Even if rows in a specific memory block 200 have concentrically encountered defects, they can be replaced. Therefore, the replacement can further freely be performed.

Also this embodiment may be adapted to the replacing method shown in FIGS. 11 to 14.

The replacing method according to each of the foregoing embodiments may be adapted to a static RAM, a dynamic RAM, various RAM or a logic LSI including a highly integrated RAM.

A seventh embodiment of the present invention will now be described with reference to FIGS. 18 to 21.

This embodiment is arranged in such a manner that a state where a defect has taken place is examined after the chip had been manufactured, and an area to be replaced by the redundant memory block is programmed by using a means such as a fuse so that the number of memory blocks, which can be replaced by one redundant memory block is changed.

Specifically, a plurality of replacement areas are disposed on the chip 100 as to select a replacement area to be adaptable to the state where the defect has taken place similarly to the structures according to the first to fourth embodiments. In order to realize this, the structure of this embodiment comprises a replacement area selection signal generating means for generating a replacement area selection signal for determining a range which can be replaced by the redundant memory block in accordance with the address signal, and a redundant memory block selection control means which brings a selected redundant memory block to a state where it can be activated only when the replacement area selection signal has been generated and which brings the redundant memory block to a non-activated state if no replacement area selection signal is generated.

Figure 18:
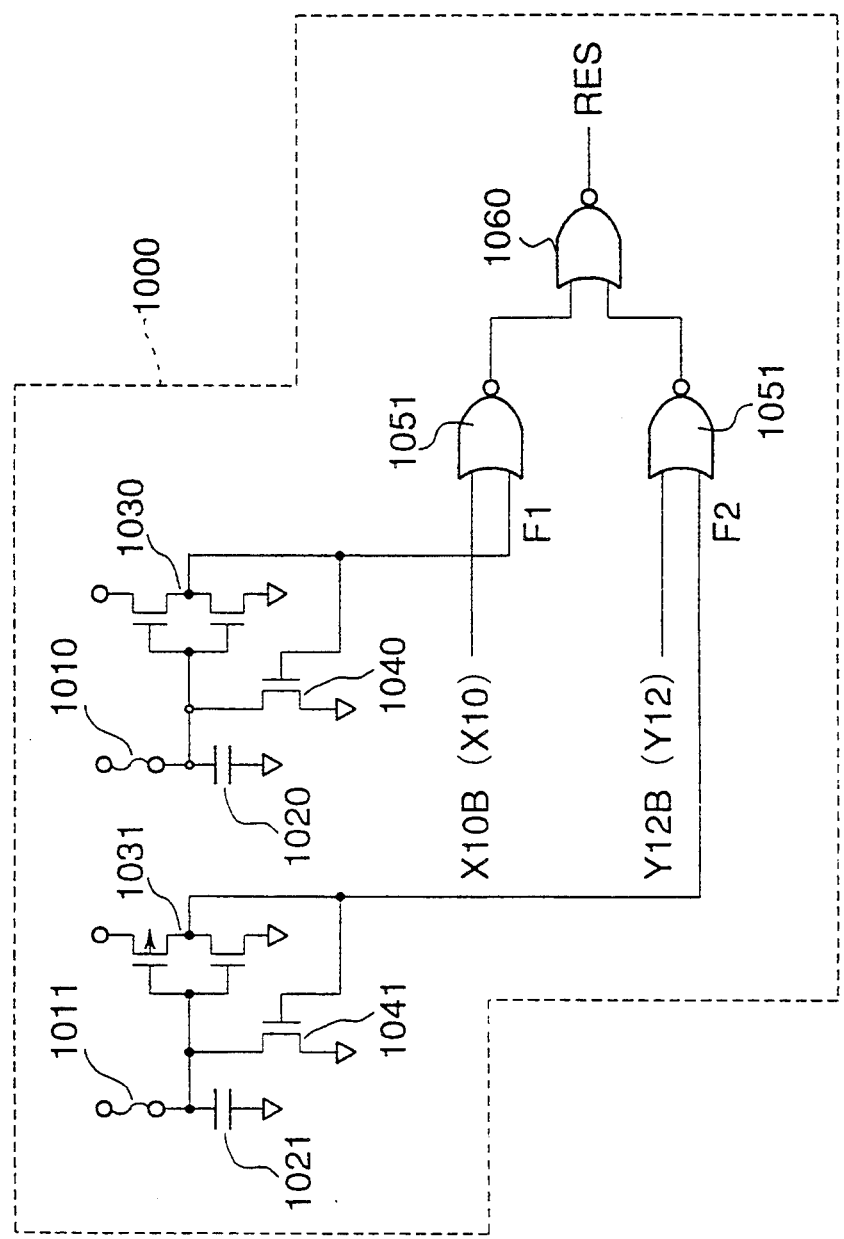
FIG. 18 is a circuit diagram which illustrates a replacement area selection signal generator.

Referring to FIG. 18, a replacement area selection signal generator 1000 comprises replacement area selection signal generating means such as two pairs of fuses 1010 and 1011 connected to the power source, capacitors 1020 and 1021, CMOS inverters 1030 and 1031, NMOS transistors 1040 and 1041 and 2-input NOR circuits 1050, 1051 and 1060.

The capacitors 1020 and 1021, the CMOS inverters 1030 and 1031 and the NMOS transistors 1040 and 1041 are formed into a signal generating circuit which generates different signals depending upon whether or not the fuses 1010 and 1011 have been interrupted (turned off). That is, when the fuses 1010 and 1011 have not been interrupted, the CMOS inverters 1030 and 1031 respectively transmit low level signals. When the fuses 1010 and 1011 have been interrupted, the CMOS inverters 1030 and 1031 respectively transmit high level signals.

The 2-input NOR circuits 1050, 1051 and 1060 are formed into replacement area selection signal generating circuits which respond to a specific logic among logics which are combinations of block selection signal X10B (signal formed by inverting signal X10), or X10 and Y12B (signal formed by inverting signal Y12) or Y12 generated in accordance with address signal and signals transmitted from the inverters CMOS inverters 1030 and 1031 as to transmit high level replacement area selection signal RES. The thus-constituted replacement area selection signal generator 1000 is formed for each redundant-only memory block 310.

In a case where the replacement area on the chip 100 is divided into four blocks as shown in FIG. 13, the replacement area selection signal generator 1000 is disposed for the redundant memory block 310 in each block. Assuming that the redundant memory blocks 310 are BLK0, BLK1, BLK2 and BLK3 respectively, block selection signals X10B and Y12B are supplied to the replacement area selection signal generator 1000 in the block BLK0, block selection signals X10 and Y12 are supplied to the replacement area selection signal generator 1000 in the block BLK1, block selection signals X10B and Y12B are supplied to the replacement area selection signal generator 1000 in the block BLK2, block selection signals X10 and Y12 are supplied to the replacement area selection signal generator 1000 in the block BLK3.

The block selection signals X10B and X10 determine the right and left half portions of the chip, while the block selection signals Y12B and Y12 determine the upper and lower half portions of the chip.

When both of the fuses 1010 and 1011 of the replacement area selection signal generator 1000 in each block are made conductive (turned on), each redundant memory block is used to replace the memory block in each quarter chip region in accordance with the logic of the block selection signal. That is, when both of the fuses 1010 and 1011 are in the conductive states, the levels of both of output signals F1 and F2 from the inverters 1030 and 1031 are lowered. Therefore, the outputs from the 2-input NOR circuits 1050 and 1051 depend upon the levels of the block selection signal X10B (or X10) and Y12B (or Y12). As a result, the 2-input NOR circuit 1060 in each block transmits a high level replacement area selection signal RES only when it responds to a specific logic of the block selection signal.

That is, only when the levels of both of the block selection signals are high, the level of the replacement area selection signal RES is raised. Therefore, defective cells present in the two memory blocks in the upper left quarter chip region can be replaced. In the block BLK1, the level of the selection signal RES is raised only when the levels of both of the block selection signals X10 and Y12B are high (defective cells present in the memory block in the upper right quarter chip region can be replaced). In the block BLK2, the level of the selection signal RES is raised only when the levels of both of the block selection signals X10B and Y12 are high (defective cells present in the memory block in the lower left quarter chip region can be replaced). In the block BLK3, the level of the selection signal RES is raised only when the levels of both of the block selection signals X10 and Y12 are high (defective cells present in the memory block in the lower right quarter chip region can be replaced).

When the chip 100 is vertically divided into two blocks as shown in FIG. 12 to replace the ½ chip area, the fuse 1010 is interrupted to make the fuse 1011 to be a conductive state. As a result, the replacement area selection signal for either of the vertical areas can be generated.

That is, when the fuse 1010 is interrupted to make the fuse 1011 to be conductive, the level of output signal F1 from the inverter 1030 is raised and that of output signal F2 from the inverter 1031 is maintained at a low level. Therefore, the replacement area selection signal RES is made regardless of the block selection signals X10B and X10.

When the two redundant-only memory blocks 310 disposed on the chip 100 are allocated to blocks BLK0 and BLK1 and the two redundant-only memory blocks 310 disposed on the chip 100 are allocated to blocks BLK2 and BLK3, the replacement area selection signal generator 1000 disposed in each block is caused to respond to the logic shown in FIG. 20.

As can be understood from FIG. 20, the level of the replacement area selection signal RES is raised in the blocks BLK0 and BLK1 only when the level of the block selection signal Y12B is high. Similarly, the level of the replacement area selection signal RES is raised in the blocks BLK2 and BLK3 only when the level of the block selection signal Y12 is high.

In a case where the chip 100 must be laterally divided into two blocks to replace the ½ chip area as shown in FIG. 11, the fuse 1010 is made conductive to interrupt the fuse 1011. As a result, a replacement area selection signal for replacing either of the right chip area or the left chip area can be generated.

That is, when the fuse 1011 is brought to the interrupted state in a state where the fuse 1010 is in a conductive state, the level of the output signal F2 from the inverter 1031 is raised and the level of the output signal F1 from the inverter 1030 is maintained at the low level. Therefore, the replacement area selection signal RES is made regardless of the block selection signals Y12B and Y12.

Therefore, the levels of the replacement area selection signals RES transmitted from the replacement area selection signal generators 1000 disposed in the blocks BLK0 and BLK2 are raised only when the level of the block selection signal X10B is high. Similarly, the levels of the replacement area selection signals RES transmitted from the blocks BLK1 and BLK3 are raised only when the level of the block selection signal X10 is high.

As described above, the replacement area selection signal for determining the area which can be replaced by the redundant memory block can be generated by combining the block selection signal and the signals transmitted from the inverters 1030 and 1031.

It should be noted that the state where both of the fuses 1010 and 1011 are interrupted will enable all areas to be replaced similarly to the first embodiment shown in FIG. 1. That is, when the levels of both of the output signals F1 and F2 from the inverters 1030 and 1031 are made high levels, the level of the replacement area selection signal RES is raised regardless of the block selection signals X10B, X10, Y12B and Y12.

Figure 21:
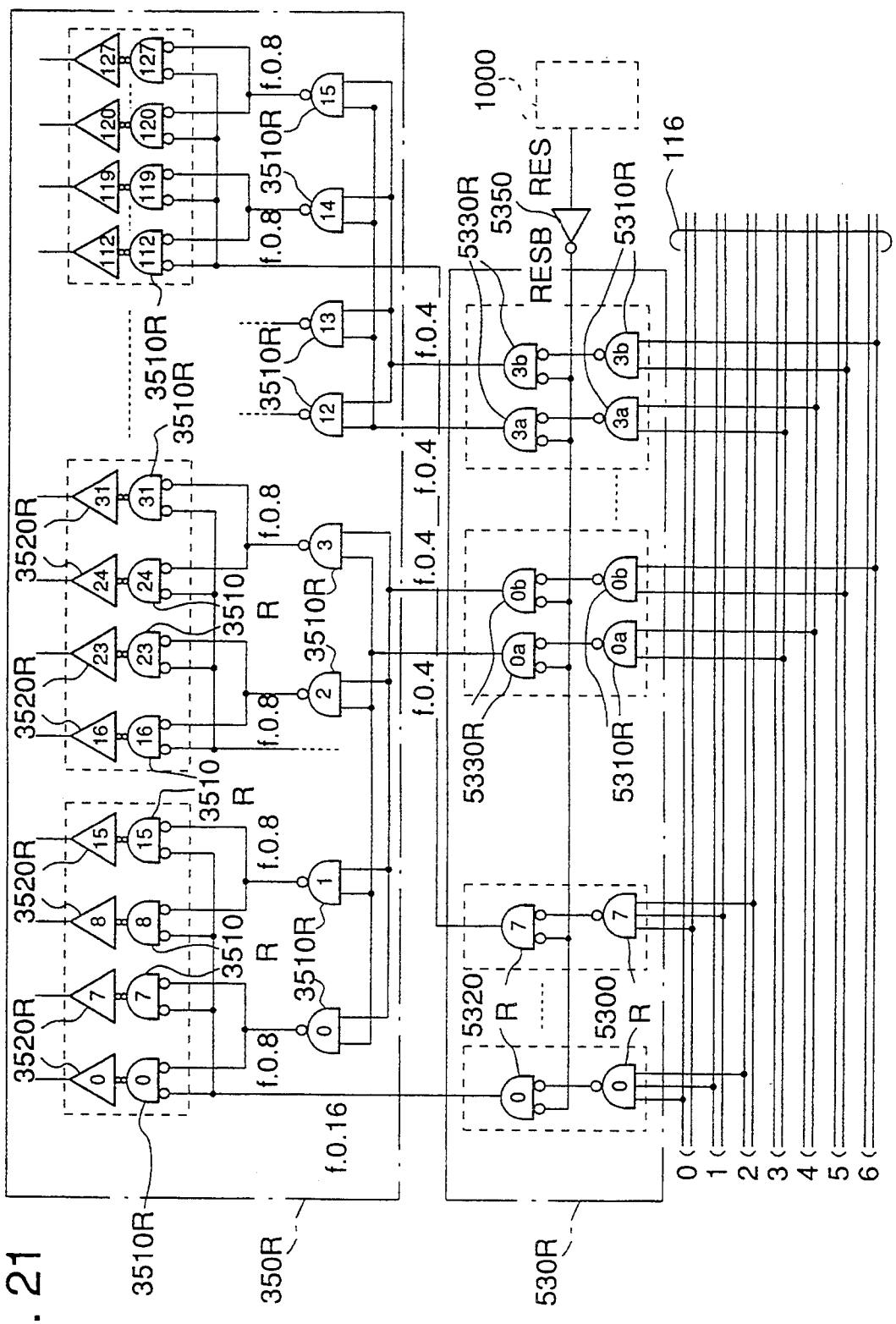
FIG. 21 is a circuit diagram which illustrates a seventh embodiment of the present invention.

The structure of the redundant memory block selection control means will now be described with reference to FIG. 21. FIG. 21 illustrates an embodiment in which a redundant word line selection operation control means is, as a function of the redundant memory block selection control means, disposed in the main word line selection decoder 530R. That is, this embodiment is arranged in such a manner that 2-input NOR circuits 5320R and 5330R are disposed on the corresponding output side of a 3-input NAND circuit group 5300R and that of a 2-input NAND circuit group 5310R which respond to the redundant main word line selection address signal so that signals transmitted from the redundant area selection signal generators 1000 are supplied to either input side of each of the 2-input NOR circuit 5320R and 5330R.

Each of the 2-input NOR circuits 5320R and 5330R receives a signal obtained by inverting the replacement area selection signal RES by way of the inverter 5350. Each of the 2-input NOR circuits 5320R and 5330R transmits a high level signal only when the level of the replacement area selection signal RES has been raised, the level of an inversion signal RES has been lowered, and level of the 3-input NAND circuit 5300R or the 2-input NAND circuit 5310R has been lowered. Only when the level of each of the 2-input NAND circuits 5320R and 5330R has been raised, the decoder 350R is operated so that a selected redundant main word line is selected and the memory cell connected to the selected redundant main word line is activated.

That is, the 2-input NAND circuits 5320R and 5330R and the inverter 5350 are formed into a redundant word line selection operation control means which enables the redundant main word line selection decoder 350R to perform the selection operation only when the level of the replacement area selection signal RES has been raised and which forcibly stops the selection operation of the decoder if the level of the replacement area selection signal RES has been lowered.

As described above, this embodiment enables an optimum replacement area to be selected among a plurality of replacement areas depending upon the state of generation of the defects after the chip has been manufactured. If concentrated defects or generated defects are limited, the ¼ chip region according to the fourth embodiment is selected as the replacement area. As a result, the redundant memory blocks, welch are operated simultaneously (four or less redundant memory blocks are simultaneously operated in the first embodiment and two or less redundant memory blocks are simultaneously operated in each of the second and third embodiment), can be integrated to one block. Therefore, the electric current consumption in the chip can be reduced.

Although this embodiment is adapted to the decoder 530R, another structure in which a similar device is disposed in each of the decoders 500R, 510R and 520R may be employed. In this case, the operation of selecting the redundant data line can be controlled and the operation of generating a signal for selecting a unit array of columns for replacing can be controlled from the redundant area.

If the same function as that of the decoder 530R is given to the decoders 500R, 510R and 520R in the foregoing case, the electric current consumption can be minimized. As an alternative to this, the function of the redundant memory block selection control means may be given to only the decoders 510R and 530R. The reason for this is that, even if the function as the redundant memory block selection control means is not given to the decoders 500R and 520R, the structure, in which the function as the redundant memory block selection control means is given to the decoders 510R and 530R, enables the selection of the main word line to be limited, and therefore, the selection of data is limited by the decoder 510R.

Figure 22:
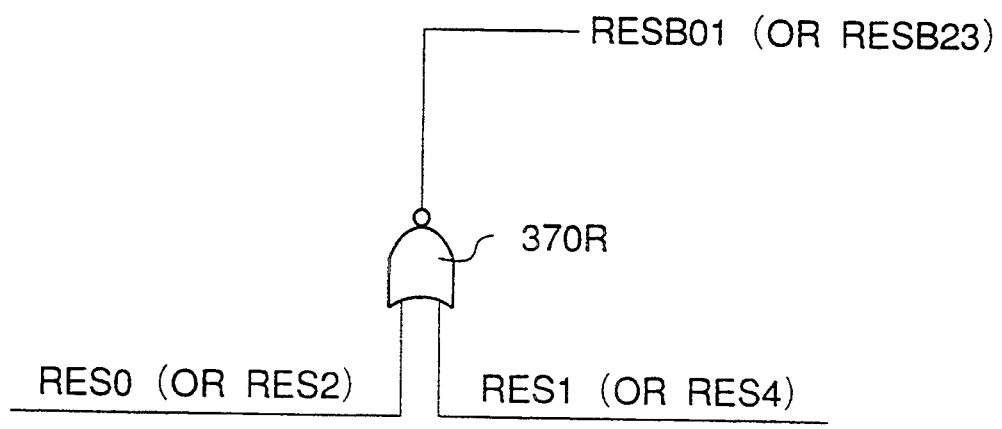
FIG. 22 is a circuit diagram which illustrates an NOR circuit.

If four redundant-only memory blocks 310 are disposed on the chip 100, the redundant main word driver 350R of the blocks BLK0 and BLK1 can be possessed by each block. Similarly, the redundant main word driver 350R can be commonly possessed by each block. That is, an NOR circuit 370R as shown in FIG. 22 is disposed to each of the blocks BLK0, BLK1, BLK2 and BLK3, the NOR logic of the replacement area selection signals RES0 and RES1 (RES2 and RES3) of the blocks BLK0 and BLK1 (BLK2 and BLK3) is calculated in the NOR circuit 370R, and an output signal from the NOR circuit 370R is supplied to the redundant main word line selection decoder 350R in either block. As a result, the redundant main word driver 350R can be operated when each of the blocks has been selected. Since the driver 350R can be commonly possessed in the foregoing case, the chip area can be reduced and the electric current consumption can be decreased.

As for the decoder 510R, it can be used as the means for controlling the operation of generating a signal for selecting unit array of columns for replacing as it is because an arbitrary area can be selected by interrupting the fuse 561. As for the decoder 510R, the 2-input NAND circuit 582 may be replaced by a 3-input NAND circuit to supply the replacement area selection signal RES to one of the three inputs.

Although the foregoing embodiments are arranged to replace the unit array of redundant columns, the unit array of redundant rows may be replaced in such a manner that the redundant area selection signal generator 1000 is disposed for each redundant only memory block and a decoder serving as the redundant memory block selection control means ids disposed, the unit array of redundant rows being replaced similarly to the foregoing embodiments.

As described above, the present invention is arranged in such a manner that, if the unit array for replacing has encountered a row defect or a column defect, the defective unit array for replacing is replaced by an arbitrary replacement unit redundant array. Therefore, even if low or column defects have taken place concentrically in a specific memory block, the defective regions can be replaced. As a result, the replacement can be performed further freely. Therefore, the manufacturing yield can be improved. Since the number of blocks to be replaced by one redundant memory block can be changed after the state where the defects have been generated had been examined, the electric current consumption in the chip can be reduced by limiting the replacement area of the redundant memory block if the concentrated defects or generation of defects are limited.

Although the invention has been described in its preferred form with a certain degree of particularly, it is understood that the present disclosure of the preferred form can be changed in the details of construction and the combination and arrangement of parts may be resorted to without departing from the spirit and the scope of the invention as hereinafter claimed.

What is claimed is:

1. A semiconductor memory comprising:
a plurality of memory mats having a plurality of unit arrays of columns for replacing in which a memory cell group connected to a data line and a word line is disposed;
a plurality of memory blocks having a plurality of said memory mats;
first data selection means which transmits a signal supplied from a data line in accordance with a command if a selected unit array of columns for replacing among a group of unit arrays of columns for replacing has no defect in each memory mat and which inhibits signal output from said data line regardless of said command if the same has a defect;
a redundant memory block having a plurality of unit arrays of redundant columns in which redundant memory cell groups each of which is connected to a redundant data line and a redundant word line are disposed to correspond to said unit arrays of columns for replacing;
second data selection means which inhibits signal output from a redundant data line regardless of a command if said unit array of redundant columns among said group of unit arrays of redundant columns in said redundant memory block is not used and which transmits a signal supplied from said redundant data line in accordance with said command if a selected unit array of redundant columns is used; and
third data selection means which selects and transmits either of said signal selected by said first data selection means or data selected by said second data selection means.

2. A semiconductor memory comprising:
a plurality of memory mats having a plurality of unit arrays of columns for replacing in which a memory cell group connected to a data line and a word line is disposed;
a plurality of memory blocks having a plurality of said memory mats;
a plurality of word line selection means which respond to a specific word line selection signal generated in accordance with an address signal as to transmit a memory cell drive signal to a selected word line among word line groups of each unit array of columns for replacing;
a plurality of data line selection means which respond to a specific data line selection signal generated in accordance with an address signal as to transmit a signal of a selected data line among data line groups of each unit array of columns for replacing;
a plurality of column replacement unit array selection signal generating means for generating a signal for selecting a unit arrays of columns for replacing for selecting an array among a group of unit arrays of columns for replacing in each memory mat on the basis of a signal group generated in accordance with said address signal;
a plurality of data line signal transfer control means which respond to said column replacement unit array selection signal as to transmit a signal selected by each data line selection means to a main data output line if said selected unit array of columns for replacing has no defect and inhibit the transmission of said signal selected by each data line selection means to said main data output line if said selected unit array of columns for replacing has a defect;
a redundant memory block having a plurality of unit arrays of redundant columns in each of which redundant memory cell groups connected to redundant data lines and redundant word lines are disposed to correspond to unit arrays of columns for replacing;
a plurality of redundant word line selection means for transmitting a memory cell drive signal to an instructed redundant word line among redundant word line groups of each unit array of redundant columns in response to a selected redundant word line selection signal generated in accordance with said address signal;
a plurality of redundant data line selection means for transmitting a signal from an instructed redundant data line among redundant data line groups in each unit array of redundant columns in response to a selected redundant data line selection signal generated in accordance with said address signal;
redundant column replacement unit array selection signal generating means for generating redundant column replacement unit array selection signal for selecting an array among a redundant column replacement unit array group of said redundant memory block on the basis of a signal group generated in accordance with said address signal;
a plurality of redundant data line signal transfer control means which respond to said redundant column replacement unit array selection signal to transmit a signal selected by each redundant data line selection means to a redundant data output line when said selected unit array of redundant columns is used and inhibit transfer of said signal selected by each redundant data line selection means to a redundant data output line when said selected unit array of redundant columns is not used; and
data output line selection means for connecting said redundant data output line, which is connected to each redundant data line signal transfer control means, to each selected main data output line.

3. A semiconductor memory comprising:
a plurality of memory mats having a plurality of unit arrays of columns for replacing in which a memory cell group connected to a data line and a word line is disposed,
a plurality of memory blocks having a plurality of said memory mats;
a plurality of word line selection means which respond to a specific word line selection signal generated in accordance with an address signal as to transmit a memory cell drive signal to a selected word line among word line groups of each unit array of columns for replacing;
a plurality of data line selection means which respond to a specific data line selection signal generated in accordance with an address signal as to transmit a signal of a selected data line among data line groups of each unit array of columns for replacing;
a plurality of column replacement unit array selection signal generating means for generating a signal for selecting a unit arrays of columns for replacing for selecting an array among a group of unit arrays of columns for replacing in each memory mat on the basis of a signal group generated in accordance with said address signal;
a plurality of data line signal transfer control means which respond to said column replacement unit array selection signal as to transmit a signal selected by each data line selection means to a main data output line if said selected unit array of columns for replacing has no defect and inhibit the transmission of said signal selected by each data line selection means to said main data output line if said selected unit array of columns for replacing has a defect;
a redundant memory block having a plurality of unit arrays of redundant columns in each of which redundant memory cell groups connected to redundant data lines and redundant word lines are disposed to correspond to unit arrays of columns for replacing;
wherein each redundant memory block includes:
a plurality of redundant word line selection means for transmitting a memory cell drive signal to an instructed redundant word line among redundant word line groups of each unit array of redundant columns in response to a selected redundant word line selection signal generated in accordance with said address signal;
a plurality of redundant data line selection means for transmitting a signal from an instructed redundant data line among redundant data line groups in each unit array of redundant columns in response to a selected redundant data line selection signal generated in accordance with said address signal;
redundant column replacement unit array selection signal generating means for generating redundant column replacement unit array selection signal for selecting an array among a redundant column replacement unit array group of said redundant memory block on the basis of a signal group generated in accordance with said address signal;
a plurality of redundant data line signal transfer control means which respond to said redundant column replacement unit array selection signal to transmit a signal selected by each redundant data line selection means to a redundant data output line when said selected unit array of redundant columns is used and inhibit transfer of said signal selected by each redundant data line selection means to a redundant data output line when said selected unit array of redundant columns is not used; and
data output line selection means for connecting said redundant data output line, which is connected to each redundant data line signal transfer control means, to each selected main data output line.

4. A semiconductor memory comprising:
a plurality of memory blocks having a plurality of unit arrays of columns for replacing in which a memory cell group connected to a data line and a word line is disposed;
a plurality of word line selection means which respond to a specific word line selection signal generated in accordance with an address signal as to transmit a memory cell drive signal to a selected word line among word line groups of each unit array of columns for replacing;
a plurality of data line selection means which respond to a specific data line selection signal generated in accordance with an address signal as to transmit a signal of a selected data line among data line groups of each unit array of columns for replacing;
a plurality of column replacement unit array selection signal generating means for generating a signal for selecting a unit arrays of columns for replacing for selecting an array among a group of unit arrays of columns for replacing in each memory mat on the basis of a signal group generated in accordance with said address signal;

a plurality of data line signal transfer control means which respond to said column replacement unit array selection signal as to transmit a signal selected by each data line selection means to a main data output line if said selected unit array of columns for replacing has no defect and inhibit the transmission of said signal selected by each data line selection means to said main data output line if said selected unit array of columns for replacing has a defect;

a redundant memory block having a plurality of unit arrays of redundant columns in each of which redundant memory cell groups connected to redundant data lines and redundant word lines are disposed to correspond to unit arrays of columns for replacing;

a plurality of redundant word line selection means for transmitting a memory cell drive signal to an instructed redundant word line among redundant word line groups of each unit array of redundant columns in response to a selected redundant word line selection signal generated in accordance with said address signal;

a plurality of redundant data line selection means for transmitting a signal from an instructed redundant data line among redundant data line groups in each unit array of redundant columns in response to a selected redundant data line selection signal generated in accordance with said address signal;

redundant column replacement unit array selection signal generating means for generating redundant column replacement unit array selection signal for selecting an array among a redundant column replacement unit array group of said redundant memory block on the basis of a signal group generated in accordance with said address signal;

a plurality of redundant data line signal transfer control means which respond to said redundant column replacement unit array selection signal to transmit a signal selected by each redundant data line selection means to a redundant data output line when said selected unit array of redundant columns is used and inhibit transfer of said signal selected by each redundant data line selection means to a redundant data output line when said selected unit array of redundant columns is not used; and data output line selection means for connecting said redundant data output line, which is connected to each redundant data line signal transfer control means, to each selected main data output line.

5. A semiconductor memory according to any one of claims 2, 3 and 4, wherein each data line selection means comprises a data line selection decoder which responds to a specific logic among logics which are combinations of block selection signals, column selection signals and mat selection signals generated from said address signal as data line selection signals as to transmit a data line activating signal, and a column switch circuit for transmitting a signal from a selected data line in response to a data line activating signal supplied from said data line selection decoder, and each redundant data line selection means comprises a redundant data line selection decoder which responds to a specific logic among logics which are combinations of said block selection signals, column selection signals and mat selection signals generated from said address signal as data line selection signals as to transmit a redundant data line activating signal, and a redundant column switch circuit for transmitting a signal supplied from a selected redundant data line in response to a redundant data line activating signal supplied from said redundant data line selection decoder.

6. A semiconductor memory according to any one of claims 2, 3 and 4, wherein each column replacement unit array selection signal generating means comprises an array selection decoder which responds to a specific logic among logics which are combinations of said block selection signals and said mat selection signals generated from said address signal as to generate a column replacement unit array selection signal, and said redundant column replacement unit array selection signal generating means comprises a plurality of fuses disposed to correspond to signal lines of a logical signal group which are combinations of said block selection signals and said mat selection signals generated from said address signal, a plurality of gate circuits which receive a logical signal among logical signal groups which are combinations of said block selection signals and said mat selection signals generated from said address signal as to transmit said supplied logical signal as it is if said fuse is not interrupted and transmit the same while inverting the logic of said supplied logical signal, and a redundant array selection decoder which receives said logical signal supplied from each gate circuit and which responds to a specific logic among logics which are combinations of said logical signal groups as to generate a redundant column replacement unit array selection signal.

7. A semiconductor memory according to any one of claims 2, 3 and 4, wherein each word line selection means comprises a main word line selection decoder which responds to a specific logic among logics which are combinations of said main word selection signals and said block selection signals generated from said address signal as signals for simultaneously selecting a plurality of word lines as to transmit a main word line selection command signal, a main word driver circuit which responds to said main word line selection command signal as to transmit a main word line drive signal to a selected main word line, a sub-word line selection decoder which responds to a specific logic among logics which are combinations of said block selection signals, said mat selection signals and row selection signals generated from said address signal as signals for selecting one word line as to transmit a sub-word line selection command signal, and a sub-driver circuit which responds to said main word line drive signal and said sub-word line selection command signal as to transmit a memory cell drive signal to a selected word line group, wherein each redundant word line selection means comprises a redundant main word line selection decoder which responds to a specific logic among logics which are combinations of said main word selection signals and said block selection signals generated from said address signal as signals for simultaneously selecting a plurality of redundant word lines as to transmit a redundant main word line selection command signal, a redundant main driver circuit which responds to said redundant main word line selection command signal as to transmit a redundant main word line drive signal to a selected redundant main word line;

a redundant sub-word line selection decoder which responds to a specific logic among logics which are combinations of said block selection signals, said mat selection signals and said row selection signals generated from said address signal as signals for selecting one redundant word line as to transmit a redundant sub-word line selection command signal, and a redundant sub-driver circuit which responds to said redundant main word line drive signal and said redundant sub-word line selection command signal as to transmit a memory cell drive signal to a selected redundant word line group.

8. A semiconductor memory according to any one of claims 2, 3 and 4, wherein each data line signal transfer control means comprises a fuse connected to a power source, a defect discrimination circuit which transmits a defect signal denoting that said unit array of columns for replacing has a defect if said fuse has been interrupted and transmits a non-defect signal denoting that said unit array of columns for replacing has no defect if said fuse is not interrupted, a control signal generating circuit which responds to said column replacement unit array selection signal only under condition that said non-defect signal has been generated from said defect discrimination circuit as to transmit an activation control signal and transmit a turning-off signal in the residual cases, and a signal transfer control circuit which responds to said activating control signal supplied from said control signal generating circuit as to transmit a signal supplied from said data line to a main data output line and which responds to said turning-off signal as to inhibit signal transfer from said data line to said main data output line, wherein each redundant data line signal transfer control means comprises a fuse connected to said power source, an array usage discrimination circuit which transmits an array usage command signal for commanding use of said unit array of redundant columns if said fuse has been interrupted and which transmits an array usage inhibition signal for inhibiting use of said unit array of redundant columns if said fuse is not interrupted, a redundant control signal generating circuit which responds to said redundant column replacement unit array selection signal only under condition that said array usage command signal has been generated from said array usage discrimination circuit as to transmit an activating signal and transmit a turning-off signal in the residual cases, and a redundant signal transfer control circuit which responds to said activating control signal supplied from said redundant control signal generating circuit as to transmit a signal supplied from said redundant data line to said redundant data output line and which responds to said turning-off control signal as to inhibit signal transfer from said redundant data line to said redundant data output line.

9. A semiconductor memory according to any one of claims 2, 3 and 4, wherein each data line selection means comprises a data line selection decoder which responds to a specific logic among logics which are combinations of block selection signals, column selection signals and mat selection signals generated from said address signal as data line selection signals as to transmit a data line activating signal, and a column switch circuit for transmitting a signal from a selected data line in response to a data line activating signal supplied from said data line selection decoder, and each redundant data line selection means comprises a redundant data line selection decoder which responds to a specific logic among logics which are combinations of said block selection signals, column selection signals and mat selection signals generated from said address signal as data line selection signals as to transmit a redundant data line activating signal, and a redundant column switch circuit for transmitting a signal supplied from a selected redundant data line in response to a redundant data line activating signal supplied from said redundant data line selection decoder, each column replacement unit array selection signal generating means comprises an array selection decoder which responds to a specific logic among logics which are combinations of said block selection signals and said mat selection signals generated from said address signal as to generate a column replacement unit array selection signal, and said redundant column replacement unit array selection signal generating means comprises a plurality of fuses disposed to correspond to signal lines of a logical signal group which are combinations of said block selection signals and said mat selection signals generated from said address signal, a plurality of gate circuits which receive a logical signal among logical signal groups which are combinations of said block selection signals and said mat selection signals generated from said address signal as to transmit said supplied logical signal as it is if said fuse is not interrupted and transmit the same while inverting the logic of said supplied logical signal, and a redundant array selection decoder which receives said logical signal supplied from each gate circuit and which responds to a specific logic among logics which are combinations of said logical signal groups as to generate a redundant column replacement unit array selection signal, each word line selection means comprises a main word line selection decoder which responds to a specific logic among logics which are combinations of said main word selection signals and said block selection signals generated from said address signal as signals for simultaneously selecting a plurality of word lines as to transmit a main word line selection command signal, a main word driver circuit which responds to said main word line selection command signal as to transmit a main word line drive signal to a selected main word line, a sub-word line selection decoder which responds to a specific logic among logics which are combinations of said block selection signals, said mat selection signals and row selection signals generated from said address signal as signals for selecting one word line as to transmit a sub-word line selection command signal, and a sub-driver circuit which responds to said main word line drive signal and said sub-word line selection command signal as to transmit a memory cell drive signal to a selected word line group, and each redundant word line selection means comprises a redundant main word line selection decoder which responds to a specific logic among logics which are combinations of said main word selection signals and said block selection signals generated from said address signal as signals for simultaneously selecting a plurality of redundant word lines as to transmit a redundant main word line selection command signal, a redundant main driver circuit which responds to said redundant main word line selection command signal as to transmit a redundant main word line drive signal to a selected redundant main word line, a redundant sub-word line selection decoder which responds to a specific logic among logics which are combinations of said block selection signals, said mat selection signals and said row selection signals generated from said address signal as signals for selecting one redundant word line as to transmit a redundant sub-word line selection command signal, and a redundant sub-driver circuit which responds to said redundant main word line drive signal and said redundant sub-word line selection command signal as to transmit a memory cell drive signal to a selected redundant word line group, and each data line signal transfer control means comprises a fuse connected to a power source, a defect discrimination circuit which transmits a defect signal denoting that said unit array of columns for replacing has a defect if said fuse has been interrupted and transmits a non-defect signal denoting that said unit array of columns for replacing has no defect if said fuse is not interrupted, a control signal generating circuit which responds to said column replacement unit array selection signal only under condition that said non-defect signal has been generated from said defect discrimination circuit as to transmit an activation control signal and transmit a turning-off signal in the residual cases, and a signal transfer control circuit which responds to said activating control signal supplied from said control signal generating circuit as to transmit a signal supplied from said data line to a main data output line and which responds to said turning-off signal as to inhibit signal transfer from said data line to said main data output line, wherein each redundant data line signal transfer control means comprises a fuse connected to said power source, an array usage discrimination circuit which transmits an array usage command signal for commanding use of said unit array of redundant columns if said fuse has been interrupted and which transmits an array usage inhibition signal for inhibiting use of said unit array of redundant columns if said fuse is not interrupted, a redundant control signal generating circuit which responds to said redundant column replacement unit array selection signal only under condition that said array usage command signal has been generated from said array usage discrimination circuit as to transmit an activating signal and transmit a turning-off signal in the residual cases, and a redundant signal transfer control circuit which responds to said activating control signal supplied from said redundant control signal generating circuit as to transmit a signal supplied from said redundant data line to said redundant data output line and which responds to said turning-off control signal as to inhibit signal transfer from said redundant data line to said redundant data output line.

10. A semiconductor memory comprising:

a plurality of memory mats having a plurality of unit arrays of rows for replacing in which a memory cell group connected to a data line and a word line is disposed;

a plurality of memory blocks having a plurality of said memory mats;

a plurality of word line selection means which respond to a specific word line selection signal generated in accordance with an address signal as to transmit a memory cell drive signal to a selected word line among word line groups of each unit array of columns for replacing;

a plurality of data line selection means which respond to a specific data line selection signal generated in accordance with an address signal as to transmit a signal of a selected data line among data line groups of each unit array of columns for replacing;

a plurality of row replacement unit array selection signal generating means for generating a signal for selecting a unit arrays of rows for replacing for selecting an array among a group of unit arrays of rows for replacing in each memory mat on the basis of a signal group generated in accordance with said address signal;

a plurality of data line signal transfer control means which respond to said row replacement unit array selection signal as to transmit a signal selected by each data line selection means to a main data output line if said selected unit array of rows for replacing has no defect and inhibit the transmission of said signal selected by each data line selection means to said main data output line if said selected unit array of rows for replacing has a defect;

a redundant memory block having a plurality of unit arrays of redundant rows in each of which redundant memory cell groups connected to redundant data lines and redundant word lines are disposed to correspond to unit arrays of rows for replacing;

a plurality of redundant word line selection means for transmitting a memory cell drive signal to an instructed redundant word line among redundant word line groups of each unit array of redundant rows in response to a selected redundant word line selection signal generated in accordance with said address signal;

a plurality of redundant data line selection means for transmitting a signal from an instructed redundant data line among redundant data line groups in each unit array of redundant rows in response to a selected redundant data line selection signal generated in .accordance with said address signal;

redundant row replacement unit array selection signal generating means for generating redundant row replacement unit array selection signal for selecting an array among a redundant row replacement unit array group of said redundant memory block on the basis of a signal group generated in accordance with said address signal;

a plurality of redundant data line signal transfer control means which respond to said redundant row replacement unit array selection signal to transmit a signal selected by each redundant data line selection means to a redundant data output line when said selected unit array of redundant rows is used and inhibit transfer of said signal selected by each redundant data line selection means to a redundant data output line when said selected unit array of redundant columns is not used; and data output line selection means for connecting said redundant data output line, which is connected to each redundant data line signal transfer control means, to each selected main data output line.

11. A semiconductor memory comprising:

a plurality of memory mats having a plurality of unit arrays of rows for replacing in which a memory cell group connected to a data line and a word line is disposed;

a plurality of memory blocks having a plurality of said memory mats;

a plurality of word line selection means which respond to a specific word line selection signal generated in accordance with an address signal as to transmit a memory cell drive signal to a selected word line among word line groups of each unit array of rows for replacing;

a plurality of data line selection means which respond to a specific data line selection signal generated in accordance with an address signal as to transmit a signal of a selected data line among data line groups of each unit array of rows for replacing;

a plurality of row replacement unit array selection signal generating means for generating a signal for selecting a unit arrays of rows for replacing for selecting an array among a group of unit arrays of rows for replacing in each memory mat on the basis Of a signal group generated in accordance with said address signal;

a plurality of data line signal transfer control means which respond to said row replacement unit array selection signal as to transmit a signal selected by each data line selection means to a main data output line if said selected unit array of rows for replacing has no defect and inhibit the transmission of said signal selected by each data line selection means to said main data output line if said selected unit array of rows for replacing has no defect;

a redundant memory block having a plurality of unit arrays of redundant rows in each of which redundant memory cell groups connected to redundant data lines and redundant word lines are disposed to correspond to unit arrays of rows for replacing;

a plurality of redundant word line selection means for transmitting a memory cell drive signal to an instructed redundant word line among redundant word line groups of each unit array of redundant rows in response to a selected redundant word line selection signal generated in accordance with said address signal;

a plurality of redundant data line selection means for transmitting a signal from an instructed redundant data line among redundant data line groups in each unit array of redundant rows in response to a selected redundant data line selection signal generated in accordance with said address signal;

redundant row replacement unit array selection signal generating means for generating redundant row replacement unit array selection signal for selecting an array among a redundant row replacement unit array group of said redundant memory block on the basis of a signal group generated in accordance with said address signal;

a plurality of redundant data line signal transfer control means which respond to said redundant row replacement unit array selection signal to transmit a signal selected by each redundant data line selection means to a redundant data output line when said selected unit array of redundant rows is used and inhibit transfer of said signal selected by each redundant data line selection means to a redundant data output line; and data output line selection means for connecting said redundant data output line, which is connected to each redundant data line signal transfer control means, to each selected main data output line.

12. A semiconductor memory comprising:

a plurality of memory mats having a plurality of unit arrays of rows for replacing in which a memory cell group connected to a data line and a word line is disposed;

a plurality of memory blocks having a plurality of said memory mats;

a plurality of word line selection means which respond to a specific word line selection signal generated in accordance with an address signal as to transmit a memory cell drive signal to a selected word line among word line groups of each unit array of rows for replacing;

a plurality of data line selection means which respond to a specific data line selection signal generated in accordance with an address signal as to transmit a signal of a selected data line among data line groups of each unit array of rows for replacing;

a plurality of row replacement unit array selection signal generating means for generating a signal for selecting a unit arrays of rows for replacing for selecting an array among a group of unit arrays of rows for replacing in each memory mat on the basis of a signal group generated in accordance with said address signal;

a plurality of data line signal transfer control means which respond to said row replacement unit array selection signal as to transmit a signal selected by each data line selection means to a main data output line if said selected unit array of rows for replacing has no defect and inhibit the transmission of said signal selected by each data line selection means to said main data output line if said selected unit array of rows for replacing has a defect;

a redundant memory block group having a plurality of unit arrays of redundant rows in each of which redundant memory cell groups connected to redundant data lines and redundant word lines are disposed to correspond to unit arrays of rows for replacing;

wherein each redundant memory block includes:

a plurality of redundant word line selection means for transmitting a memory cell drive signal to an instructed redundant word line among redundant word line groups of each unit array of redundant rows in response to a selected redundant word line selection signal generated in accordance with said address signal;

a plurality of redundant data line selection means for transmitting a signal from an instructed redundant data line among redundant data line groups in each unit array of redundant rows in response to a selected redundant data line selection signal generated in accordance with said address signal;

redundant row replacement unit array selection signal generating means for generating redundant row replacement unit array selection signal for selecting an array among a redundant row replacement unit array group of said redundant memory block on the basis of a signal group generated in accordance with said address signal;

a plurality of redundant data line signal transfer control means which respond to said redundant row replacement unit array selection signal to transmit a signal selected by each redundant data line selection means to a redundant data output line when said selected unit array of redundant rows is used and inhibit transfer of said signal selected by each redundant data line selection means to a redundant data output line when said selected unit array of redundant columns is not used; and data output line selection means for connecting said redundant data output line, which is connected to each redundant data line signal transfer control means, to each selected main data output line.

13. A semiconductor memory comprising:

a plurality of memory blocks having a plurality of unit arrays of rows for replacing in which a memory cell group connected to a data line and a word line is disposed;

a plurality of word line selection means which respond to a specific word line selection signal generated in accordance with an address signal as to transmit a memory cell drive signal to a selected word line among word line groups of each unit array of rows for replacing;

a plurality of data line selection means which respond to a specific data line selection signal generated in accordance with an address signal as to transmit a signal of a selected data line among data line groups of each unit array of rows for replacing;

a plurality of row replacement unit array selection signal generating means for generating a signal for selecting a unit arrays of rows for replacing for selecting an array among a group of unit arrays of rows for replacing in each memory mat on the basis of a signal group generated in accordance with said address signal;

a plurality of data line Signal transfer control means which respond to said row replacement unit array selection signal as to transmit a signal selected by each data line selection means to a main data output line if said selected unit array of rows for replacing has no defect and inhibit the transmission of said signal selected by each data line selection means to said main data output line if said selected unit array of rows for replacing has a defect;

a redundant memory block group having a plurality of unit arrays of redundant rows in each of which redundant memory cell groups connected to redundant data lines and redundant word lines are disposed to correspond to unit arrays of rows for replacing;

a plurality of redundant word line selection means for transmitting a memory cell drive signal to an instructed redundant word line among redundant word line groups of each unit array of redundant rows in response to a selected redundant word line selection signal generated in accordance with said address signal;

a plurality of redundant data line selection means for transmitting a signal from an instructed redundant data line among redundant data line groups in each unit array of redundant rows in response to a selected redundant data line selection signal generated in accordance with said address signal;

redundant row replacement unit array selection signal generating .means for generating redundant row replacement unit array selection signal for selecting an array among a redundant row replacement unit array group of said redundant memory block on the basis of a signal group generated in accordance with said address signal;

a plurality of redundant data line signal transfer control means which respond to said redundant row replacement unit array selection signal to transmit a signal selected by each redundant data line selection means to a redundant data output line when said selected unit array of redundant rows is used and inhibit transfer of said signal selected by each redundant data line selection means to a redundant data output line when said selected unit array of redundant columns is not used;

data output line selection means for connecting said redundant data output line, which is connected to each redundant data line signal transfer control means, to each selected main data output line.

14. A semiconductor memory according to any one of claims 11, 12 and 13, wherein each data line selection means comprises a data line selection decoder which responds to a specific logic among logics which are combinations of block selection signals and column selection signals generated from said address signal as data line selection signals as to transmit a data line activating signal, and a column switch circuit for transmitting a signal from a selected data line in response to a data line activating signal supplied from said data line selection decoder, and each redundant data line selection means comprises a redundant data line selection decoder which responds to a specific logic among logics which are combinations of said block selection signals, column selection signals and mat selection signals generated from said address signal as data line selection signals as to transmit a redundant data line activating signal, and a redundant column switch circuit for transmitting a signal supplied from a selected redundant data line in response to a redundant data line activating signal supplied from said redundant data line selection decoder.

15. A semiconductor memory according to any one of claims 11, 12 and 13, wherein each row replacement unit array selection signal generating means comprises an array selection decoder which responds to a specific logic among logics which are combinations of said block selection signals and replacement unit selection signals generated from said address signal as to generate a row replacement unit array selection signal, and said redundant row replacement unit array selection signal generating means comprises a plurality of fuses disposed to correspond to signal lines of a logical signal group which are combinations of said block selection signals and said mat selection signals generated from said address signal, a plurality of gate circuits which receive a logical signal among logical signal groups which are combinations of said block selection signals and said mat selection signals generated from said address signal as to transmit said supplied logical signal as it is if said fuse is not interrupted and transmit the same while inverting the logic of said supplied logical signal, and a redundant array selection decoder which receives said logical signal supplied from each gate circuit and which responds to a specific logic among logics which are combinations of said logical signal groups as to generate a redundant row replacement unit array selection signal.

16. A semiconductor memory according to any one of claims 11, 12 and 13, wherein each word line selection means comprises a word line selection decoder which responds to a specific logic among logics which are combinations of block selection signals, replacement unit selection signals and row selection signals generated from said address signal as a word line selection signal as to transmit a word line activating signal and a driver circuit which responds to said word line activating signal as to transmit a memory cell drive signal to a selected word line, and each redundant word line selection means comprises a redundant word line selection decoder which responds to a specific logic among logics which are combinations of said block selection signals, said replacement unit selection signals and said row selection signals generated from said address signal as redundant word line selection signals as to transmit a redundant word line activating signal, and a redundant driver circuit which responds to said redundant word line activating signal as to transmit a memory cell drive signal to a selected redundant word line.

17. A semiconductor memory according to any one of claims 11, 12 and 13, wherein each data line signal transfer control means comprise a fuse connected to a power source, a defect discrimination circuit which transmits a defect signal denoting that said unit array of rows for replacing has a defect if said fuse has been interrupted and transmits a non-defect signal denoting that said unit array of rows for replacing has no defect if said fuse is not interrupted, a control signal generating circuit which responds to said row replacement unit array selection signal only under condition that said non-defect signal has been generated from said defect discrimination circuit as to transmit an activation control signal and transmit a turning-off signal in the residual cases, and a signal transfer control circuit which responds to said activating control signal supplied from said control signal generating circuit as to transmit a signal supplied from said data line to a main data output line and which responds to said turning-off signal as to inhibit signal transfer from said data line to said main data output line, wherein each redundant data line signal transfer control means comprises a fuse connected to said power source, an array usage discrimination circuit which transmits an array usage command signal for commanding use of said unit array of redundant rows if said fuse has been interrupted and which transmits an array usage inhibition signal for inhibiting use of said unit array of redundant rows if said fuse is not interrupted, a redundant control signal generating circuit which responds to said redundant row replacement unit array selection signal only under condition that said array usage command signal has been generated from said array usage discrimination circuit as to transmit an activating signal and transmit a turning-off signal in the residual cases, and a redundant signal transfer control circuit which responds to said activating control signal supplied from said redundant control signal generating circuit as to transmit a signal supplied from said redundant data line to said redundant data output line and which responds to said turning-off control signal as to inhibit signal transfer from said redundant data line to said redundant data output line.

18. A semiconductor memory according to any one of claims 11, 12 and 13, wherein each data line selection means comprises a data line selection decoder which responds to a specific logic among logics which are combinations of block selection signals and column selection signals generated from said address signal as data line selection signals as to transmit a data line activating signal, and a column switch circuit for transmitting a signal from a selected data line in response to a data line activating signal supplied from said data line selection decoder, and each redundant data line selection means comprises a redundant data line selection decoder which responds to a specific logic among logics which are combinations of said block selection signals, and column selection signals generated from said address signal as data line selection signals as to transmit a redundant data line activating signal, and a redundant column switch circuit for transmitting a signal supplied from a selected redundant data line in response to a redundant data line activating signal supplied from said redundant data line selection decoder, each row replacement unit array selection signal generating means comprises an array selection decoder which responds to a specific logic among logics which are combinations of said block selection signals and said replacement unit selection signals generated from said address signal as to generate a row replacement unit array selection signal, and said redundant row replacement unit array selection signal generating means comprises a plurality of fuses disposed to correspond to signal lines of a logical signal group which are combinations of said block selection signals and said mat selection signals generated from said address signal, a plurality of gate circuits which receive a logical signal among logical signal groups which are combinations of said block selection signals and said replacement unit selection signals generated from said address signal as to transmit said supplied logical signal as it is if said fuse is not interrupted and transmit the same while inverting the logic of said supplied logical signal, and a redundant array selection decoder which receives said logical signal supplied from each gate circuit and which responds to a specific logic among logics which are combinations of said logical signal groups as to generate a redundant row replacement unit array selection signal, each word line selection means comprises a word line selection decoder which responds to a specific logic among logics which are combinations of said block selection signals, said replacement unit selection signals and said row selection signals generated from said address signal as word line selection signals as to transmit a word line activating signal, and a driver circuit which responds to said word line activating signal as to transmit a memory cell drive signal to a selected word line, each redundant word line selection means comprises a redundant word line selection decoder which responds to a specific logic among logics which are combinations of said block selection signals, said replacement unit selection signals and said row selection signals generated from said address signal as redundant word line selection signals as to transmit a redundant word line activating signal and a redundant driver circuit which responds to said redundant word line activating signal as to transmit a memory cell drive signal to a selected redundant Word line, each data line signal transfer control means comprises a fuse connected to a power source, a defect discrimination circuit which transmits a defect signal denoting that said unit array of rows for replacing has a defect if said fuse has been interrupted and transmits a non-defect signal denoting that said unit array of rows for replacing has no defect if said fuse is not interrupted, a control signal generating circuit which responds to said row replacement unit array selection signal only under condition that said non-defect signal has been generated from said defect discrimination circuit as to transmit an activation control signal and transmit a turning-off signal in the residual cases, and a signal transfer control circuit which responds to said activating control signal supplied from said control signal generating circuit as to transmit a signal supplied from said data line to a main data output line and which responds to said turning-off signal as to inhibit signal transfer from said data line to said main data output line, wherein each redundant data line signal transfer control means comprises a fuse connected to said power source, an array usage discrimination circuit which transmits an array usage command signal for commanding use of said unit array of redundant rows if said fuse has been interrupted and which transmits an array usage inhibition signal for inhibiting use of said unit array of redundant rows if said fuse is not interrupted, a redundant control signal generating circuit which responds to said redundant row replacement unit array selection signal only under condition that said array usage command signal has been generated from said array usage discrimination circuit as to transmit an activating signal and transmit a turning-off signal in the residual cases, and a redundant signal transfer control circuit which responds to said activating control signal supplied from said redundant control signal generating circuit as to transmit a signal supplied from said redundant data line to said redundant data output line and which responds to said turning-off control signal as to inhibit signal transfer from said redundant data line to said redundant data output line.

19. A semiconductor memory according to claim 8, wherein each data line signal transfer control means has, on the output side of said signal transfer control circuit, a bipolar transistor forming an emitter follower circuit or a collector follower circuit, the emitter or collector outputs of bipolar transistors are connected in a wired-OR manner, each redundant data line signal transfer control means has, on the output side of said redundant signal transfer control circuit, a bipolar transistor forming an emitter follower circuit or a collector follower circuit, and the emitter or collector .outputs of bipolar transistors are connected in a wired-OR manner.

20. A semiconductor memory according to any one of claims 1, 2, 3, 4, 10, 11, 12 and 13, wherein said redundant memory block is disposed more adjacent to said data output line selection means than the residual memory blocks.

21. A semiconductor memory comprising:
a plurality of memory mats having a plurality of unit arrays of columns for replacing in which a memory cell group connected to a data line and a word line is disposed; and
a plurality of memory blocks having a plurality of said memory mats, wherein each redundant memory block has
a plurality of word line selection means which respond to a specific word line selection signal generated in accordance with an address signal as to transmit a memory cell drive signal to a selected word line among word line groups of each unit array of columns for replacing;
a plurality of data line selection means which respond to a specific data line selection signal generated in accordance with an address signal as to transmit a signal of a selected data line among data line groups of each unit array of columns for replacing;
a plurality of column replacement unit array selection signal generating means for generating a signal for selecting a unit arrays of columns for replacing for selecting an array among a group of unit arrays of .columns for replacing in each memory mat on the basis of a signal group generated in accordance with said address signal;
a plurality of data line signal transfer control means which respond to said column replacement unit array selection signal as to transmit a signal selected by each data line selection means to a main data output line if said selected unit array of columns for replacing has no defect and inhibit the transmission of said signal selected by each data line selection means to said main data output line if said selected unit array of columns for replacing has no defect;
a redundant memory block group having a plurality of unit arrays of redundant columns in each of which redundant memory cell groups connected to redundant data lines and redundant word lines are disposed to correspond to unit arrays of columns for replacing;
a plurality of redundant word line selection means for transmitting a memory cell drive signal to an instructed redundant word line among redundant word line groups of each unit array of redundant columns in response to a selected redundant word line selection signal generated in accordance with said address signal;

a plurality of redundant data line selection means for transmitting a signal from an instructed redundant data line among redundant data line groups in each unit array of redundant columns in response to a selected redundant data line selection signal generated in accordance with said address signal;

redundant column replacement unit array selection signal generating means for generating redundant column replacement unit array selection signal for selecting an array among a redundant column replacement unit array group of said redundant memory block on the basis of a signal group generated in accordance with said address signal;

a plurality of redundant data line signal transfer control means which respond to said redundant column replacement unit array selection signal to transmit a signal selected by each redundant data line selection means to a redundant data output line when said selected unit array of redundant columns is used and inhibit transfer of said signal selected by each redundant data line selection means to a redundant data output line;

data output line selection means for connecting said redundant data output line, which is connected to each redundant data line signal transfer control means, to each selected main data output line;

replacement area selection signal generating means for generating a replacement area selection signal which determines the range which can be replaced by said redundant memory block group in accordance with said address signal;

a plurality of redundant word line selection operation control means which enable a selected redundant word line selecting means to perform a selection operation only under condition that said replacement area selection signal has been generated and which forcibly stop said selection operation in the residual cases;

a plurality of redundant data line selection operation control means which enable a selected redundant data line selection means to perform a selection operation only under condition that said replacement area selection signal has been generated and which forcibly stop said selection operation in the residual cases; and a plurality of redundant column replacement unit array selection signal generation operation control means which enable a selected redundant column replacement unit array selection signal generating means to perform a generation operation only under condition that said replacement area selection signal has been generated and which forcibly stop said generation operation in the residual cases.

22. A semiconductor memory comprising:

a plurality of memory mats having a plurality of unit arrays of columns for replacing in which a memory cell group connected to a data line and a word line is disposed;

a plurality of memory blocks having a plurality of said memory mats;

a plurality of word line selection means which respond to a specific word line selection signal generated in accordance with an address signal as to transmit a memory cell drive signal to a selected word line among word line groups of each unit array of columns for replacing;

a plurality of data line selection means which respond to a specific data line selection signal generated in accordance with an address signal as to transmit a signal of a selected data line among data line groups of each unit array of columns for replacing;

a plurality of column replacement unit array selection signal generating means for generating a signal for selecting a unit arrays of columns for replacing for selecting an array among a group of unit arrays of columns for replacing in each memory mat on the basis of a signal group generated in accordance with said address signal;

a plurality of data line signal transfer control means which respond to said column replacement unit array selection signal as to transmit a signal selected by each data line selection means to a main data output line if said selected unit array of columns for replacing has no defect and inhibit the transmission of said signal selected by each data line selection means to said main data output line if said selected unit array of columns for replacing has no defect;

a redundant memory block group having a plurality of unit arrays of redundant columns in each of which redundant memory cell groups connected to redundant data lines and redundant word lines are disposed to correspond to unit arrays of columns for replacing, wherein each redundant memory block has a plurality of redundant word line selection means for transmitting a memory cell drive signal to an instructed redundant word line among redundant word line groups of each unit array of redundant columns in response to a selected redundant word line selection signal generated in accordance with said address signal;

a plurality of redundant data line selection means for transmitting a signal from an instructed redundant data line among redundant data line groups in each unit array of redundant columns in response to a selected redundant data line selection signal generated in accordance with said address signal;

redundant column replacement unit array selection signal generating means for generating redundant column replacement unit array selection signal for selecting an array among a redundant column replacement unit array group of said redundant memory block on the basis of a signal group generated in accordance with said address signal;

a plurality of redundant data line signal transfer control means which respond to said redundant column replacement unit array selection signal to transmit a signal selected by each redundant data line selection means to a redundant data output line when said selected unit array of redundant columns is used and inhibit transfer of said signal selected by each redundant data line selection means to a redundant data output line;

data output line selection means for connecting said redundant data output line, which is connected to each redundant data line signal transfer control means, to each selected main data output line;

replacement area selection signal generating means for generating a replacement area selection signal which determines the range which can be replaced by said redundant memory block group in accordance with said address signal;

a plurality of redundant word line selection operation control means which enable a selected redundant word line selection means to perform a selection operation only under condition that said replacement area selection signal has been generated and which forcibly stop said selection operation in the residual cases; and a plurality of redundant column replacement unit array selection signal generation operation control means which enable a selected redundant column replacement unit array selection signal generating means to perform a generation operation only under condition that said replacement area selection signal has been generated and which forcibly stop said generation operation in the residual cases.

23. A semiconductor memory comprising:

a plurality of memory mats having a plurality of unit arrays of rows for replacing in which a memory cell group connected to a data line and a word line is disposed;

a plurality of memory blocks having a plurality of said memory mats;

a plurality of word line selection means which respond to a specific word line selection signal generated in accordance with an address signal as to transmit a memory cell drive signal to a selected word line among word line groups of each unit array of rows for replacing;

a plurality of data line selection means which respond to a specific data line selection signal generated in accordance with an address signal as to transmit a signal of a selected data line among data line groups of each unit array of rows for replacing;

a plurality of row replacement unit array selection signal generating means for generating a signal for selecting a unit arrays of rows for replacing for selecting an array among a group of unit arrays of rows for replacing in each memory mat on the basis of a signal group generated in accordance with said address signal;

a plurality of data line signal transfer control means which respond to said row replacement unit array selection signal as to transmit a signal selected by each data line selection means to a main data output line if said selected unit array of rows for replacing has no defect and inhibit the transmission of said signal selected by each data line selection means to said main data output line if said selected unit array of rows for replacing has no defect;

a redundant memory block group having a plurality of unit arrays of redundant rows in each of which redundant memory cell groups connected to redundant data lines and redundant word lines are disposed to correspond to unit arrays of rows for replacing, wherein each redundant memory block includes:

a plurality of redundant word line selection means for transmitting a memory cell drive signal to an instructed redundant word line among redundant word line groups of each unit array of redundant rows in response to a selected redundant word line selection signal generated in accordance with said address signal;

a plurality of redundant data line selection means for transmitting a signal from an instructed redundant data line among redundant data line groups in each unit array of redundant rows in response to a selected redundant data line selection signal generated in accordance with said address signal;

redundant row replacement unit array selection signal generating means for generating redundant row replacement unit array selection signal for selecting an array among a redundant row replacement unit array group of said redundant memory block on the basis of a signal group generated in accordance with said address signal;

a plurality of redundant data line signal transfer control means which respond to said redundant row replacement unit array selection signal to transmit a signal selected by each redundant data line selection means to a redundant data output line when said selected unit array of redundant rows is used and inhibit transfer of said signal selected by each redundant data line selection means to a redundant data output line;

data output line selection means for connecting said redundant data output line, which is connected to each redundant data line signal transfer control means, to each selected main data output line;

replacement area selection signal generating means for generating a replacement area selection signal which determines the range which can be replaced by said redundant memory block group in accordance with said address signal;

a plurality of redundant word line selection operation control means which enable a selected redundant word line selection means to perform a selection operation only under condition that said replacement area selection signal has been generated and which forcibly stop said selection operation in the residual cases;

a plurality of redundant data line selection operation control means which enable a selected redundant data line selection means to perform a selection operation only under condition that said replacement area selection signal has been generated and which forcibly stop said selection operation in the residual cases; and a plurality of redundant row replacement unit array selection signal generation operation control means which enable a selected redundant row replacement unit array selection signal generating means to perform a generation operation only under condition that said replacement area selection signal has been generated and which forcibly stop said generation operation in the residual cases.

24. A semiconductor memory comprising:

a plurality of memory mats having a plurality of unit arrays of columns for replacing in which a memory cell group connected to a data line and a word line is disposed;

a plurality of memory blocks having a plurality of said memory mats;

a plurality of word line selection means which respond to a specific word line selection signal generated in accordance with an address signal as to transmit a memory cell drive signal to a selected word line among word line groups of each unit array of rows for replacing;

a plurality of data line selection means which respond to a specific data line selection signal generated in accordance with an address signal as to transmit a signal of a selected data line among data line groups of each unit array of rows for replacing;

a plurality of row replacement unit array selection signal generating means for generating a signal for selecting a unit arrays of rows for replacing for selecting an array among a group of unit arrays of rows for replacing in each memory mat on the basis of a signal group generated in accordance with said address signal;

a plurality of data line signal transfer control means which respond to said row replacement unit array selection signal as to transmit a signal selected by each data line selection means to a main data output line if said selected unit array of rows for replacing has no defect and inhibit the transmission of said signal selected by each data line selection means to said main data output line if said selected unit array of rows for replacing has no defect;

a redundant memory block group having a plurality of unit arrays of redundant rows in each of which redundant memory cell groups connected to redundant data lines and redundant word lines are disposed to correspond to unit arrays of rows for replacing, wherein each redundant memory block has a plurality of redundant word line selection means for transmitting a memory cell drive signal to an instructed redundant word line among redundant word line groups of each unit array of redundant rows in response to a selected redundant word line selection signal generated in accordance with said address signal;

a plurality of redundant data line selection means for transmitting a signal from an instructed redundant data line among redundant data line groups in each unit array of redundant rows in response to a selected redundant data line selection signal generated in accordance with said address signal;

redundant row replacement unit array selection signal generating means for generating redundant row replacement unit array selection signal for selecting an array among a redundant row replacement unit array group of said redundant memory block on the basis of a signal group generated in accordance with said address signal;

a plurality of redundant data line signal transfer control means which respond to said redundant row replacement unit array selection signal to transmit a signal selected by each redundant data line selection means to a redundant data output line when said selected unit array of redundant rows is used and inhibit transfer of said signal selected by each redundant data line selection means to a redundant data output line;

data output line selection means for connecting said redundant data output line, which is connected to each redundant data line signal transfer control means, to each selected main data output line;

replacement area selection signal generating means for generating a replacement area selection signal which determines the range which can be replaced by said redundant memory block group in accordance with said address signal;

a plurality of redundant word line selection operation control means which enable a selected redundant word line selection means to perform a selection operation only under condition that said replacement area selection signal has been generated and which forcibly stop said selection operation in the residual cases; and a plurality of redundant row replacement unit array selection signal generation operation control means which enable a selected redundant row replacement unit array selection signal generating means to perform a generation operation only under condition that said replacement area selection signal has been generated and which forcibly stop said generation operation in the residual cases.

25. A semiconductor memory according to any one of claims 21, 22, 23 and 24, wherein each replacement area selection signal generating means comprises a plurality of fuses connected to said power source, a plurality of signal generating circuits for generating different signals depending upon whether or not each of said fuses has been interrupted, and a replacement area selection signal generating circuit which responds to a specific logic among logics which are combinations of a signal supplied from each signal generating circuit and said block selection signals generated from said address signal as to generate a replacement area selection signal.

26. A semiconductor memory comprising:
a plurality of memory blocks having, for each block, a plurality of replacement unit arrays in each of which a memory cell group for storing data is disposed;

a redundant memory block having a plurality of redundant replacement unit arrays in each of which a redundant memory cell group for storing data is disposed;

access means for giving an access to a memory access of an instructed replacement unit array in each memory block;

redundant replacement unit array instruction means for instructing a redundant replacement unit array which corresponds to a replacement unit array of said memory block that has encountered a defect if any one of said memory blocks has encountered the defect; and data selection means for transmitting as it is data supplied from said instructed replacement unit array which has been accessed by said access means if said instructed replacement unit array has no defect when data is transmitted from each memory block, and selecting and transmitting data supplied from said redundant replacement unit array which has been instructed by said redundant replacement unit array instruction means if said instructed replacement unit array has encountered a defect.

27. A semiconductor memory comprising:
a plurality of memory blocks having, for each block, a plurality of column replacement unit arrays in each of which a memory cell group for storing data is disposed;

a redundant memory block having a plurality of redundant column replacement unit arrays in each of which a redundant memory cell group for storing data is disposed;

access means for giving an access to a memory cell of an instructed column replacement unit array in each memory block;

redundant replacement unit array instruction means for instructing a redundant column replacement unit array which corresponds to a column replacement unit array of said memory block that has encountered a defect if any one of said memory blocks has encountered the defect; and data selection means for transmitting as it is data supplied from said instructed column replacement unit array which has been accessed by said access means if said instructed column replacement unit array has no defect when data is transmitted from each memory block, and selecting and transmitting data supplied from said redundant column replacement unit array which has been instructed by said redundant replacement unit array instruction means if said instructed column replacement unit array has encountered a defect.

28. A semiconductor memory comprising:

a plurality of memory blocks having, for each block, a plurality of row replacement unit arrays in each of which a memory cell group for storing data is disposed;

a redundant memory block having a plurality of redundant row replacement unit arrays in each of which a redundant memory cell group for storing data is disposed;

access means for giving an access to a memory cell of an instructed row replacement unit array in each memory block;

redundant replacement unit array instruction means for instructing a redundant row replacement unit array which corresponds to a row replacement unit array of said memory block that has encountered a defect if any one of said memory blocks has encountered the defect; and data selection means for transmitting as it is data supplied from said instructed row replacement unit array which has been accessed by said access means if said instructed row replacement unit array has no defect when data is transmitted from each memory block, and selecting and transmitting data supplied from said redundant row replacement unit array which has been instructed by said redundant replacement unit array instruction means if said instructed row replacement unit array has encountered a defect.

29. A semiconductor memory according to claim 9, wherein each data line signal transfer control means has, on the output side of said signal transfer control circuit, a bipolar transistor forming an emitter follower circuit or a collector follower circuit, the emitter or collector outputs of bipolar transistors are connected in a wired-OR manner, each redundant data line signal transfer control means has, on the output side of said redundant signal transfer control circuit, a bipolar transistor forming an emitter follower circuit or a collector follower circuit, and the emitter or collector outputs of bipolar transistors are connected in a wired-OR manner.

30. A semiconductor memory according to claim 17, wherein each data line signal transfer control means has, on the output side of said signal transfer control circuit, a bipolar transistor forming an emitter follower circuit or a collector follower circuit, the emitter or collector outputs of bipolar transistors are connected in a wired-OR manner, each redundant data line signal transfer control means has, on the output side of said redundant signal transfer control circuit, a bipolar transistor forming an emitter follower circuit or a collector follower circuit, and the emitter or collector outputs of bipolar transistors are connected in a wired-OR manner.

31. A semiconductor memory according to claim 18, wherein each data line signal transfer control means has, on the output side of said signal transfer control circuit, a bipolar transistor forming an emitter follower circuit or a collector follower circuit, the emitter or collector outputs of bipolar transistors are connected in a wired-OR manner, each redundant data line signal transfer control means has, on the output side of said redundant signal transfer control circuit, a bipolar transistor forming an emitter follower circuit or a collector follower circuit, and the emitter or collector outputs of bipolar transistors are connected in a wired-OR manner.

* * * * *

UNITED STATES PATENT AND TRADEMARK OFFICE
CERTIFICATE OF CORRECTION

PATENT NO.  : 5,392,246
DATED       : February 21, 1995
INVENTOR(S) : AKIYAMA et al.

It is certified that error appears in the above-indentified patent and that said Letters Patent is hereby corrected as shown below:

Column 4, line 63, "and the block selection signals" should be deleted.

Column 4, line 64, 'the" should be deleted.

Column 5, line 5, "block selection signals, the mat selection signals and" should be deleted.

Column 16, line 60, "block" should be deleted.

Column 16, line 61, "selection signal and the" should be deleted.

Column 17, line 7, "the block" should be deleted.

Column 17, line 8, "selection signal, the mat selection signal and" should be deleted.

In the drawing:

Figs. 3, 8 and 9 should be replaced by the corrected Figs. 3, 8 and 9 shown on the attached PTO-1050 forms.

Signed and Sealed this

Twenty-sixth Day of March, 1996

*Attest:*

BRUCE LEHMAN

*Attesting Officer*   Commissioner of Patents and Trademarks

UNITED STATES PATENT AND TRADEMARK OFFICE
CERTIFICATE OF CORRECTION

PATENT NO. : 5,392,246  Page 2 of 4
DATED : February 21, 1995
INVENTOR(S) : N. AKIYAMA et al.

It is certified that error appears in the above-indentified patent and that said Letters Patent is hereby corrected as shown below:

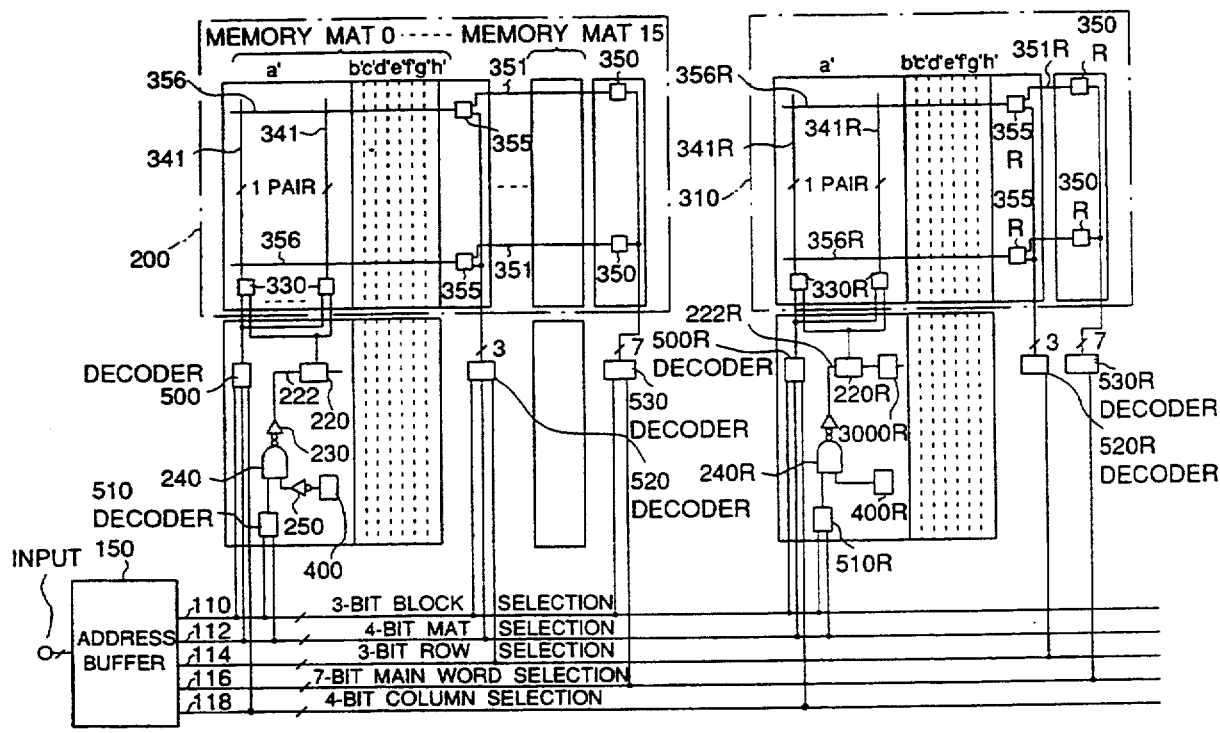

FIG. 3

UNITED STATES PATENT AND TRADEMARK OFFICE
CERTIFICATE OF CORRECTION

PATENT NO. : 5,392,246
DATED : February 21, 1995
INVENTOR(S) : N. AKIYAMA et al.

Page 3 of 4

It is certified that error appears in the above-indentified patent and that said Letters Patent is hereby corrected as shown below:

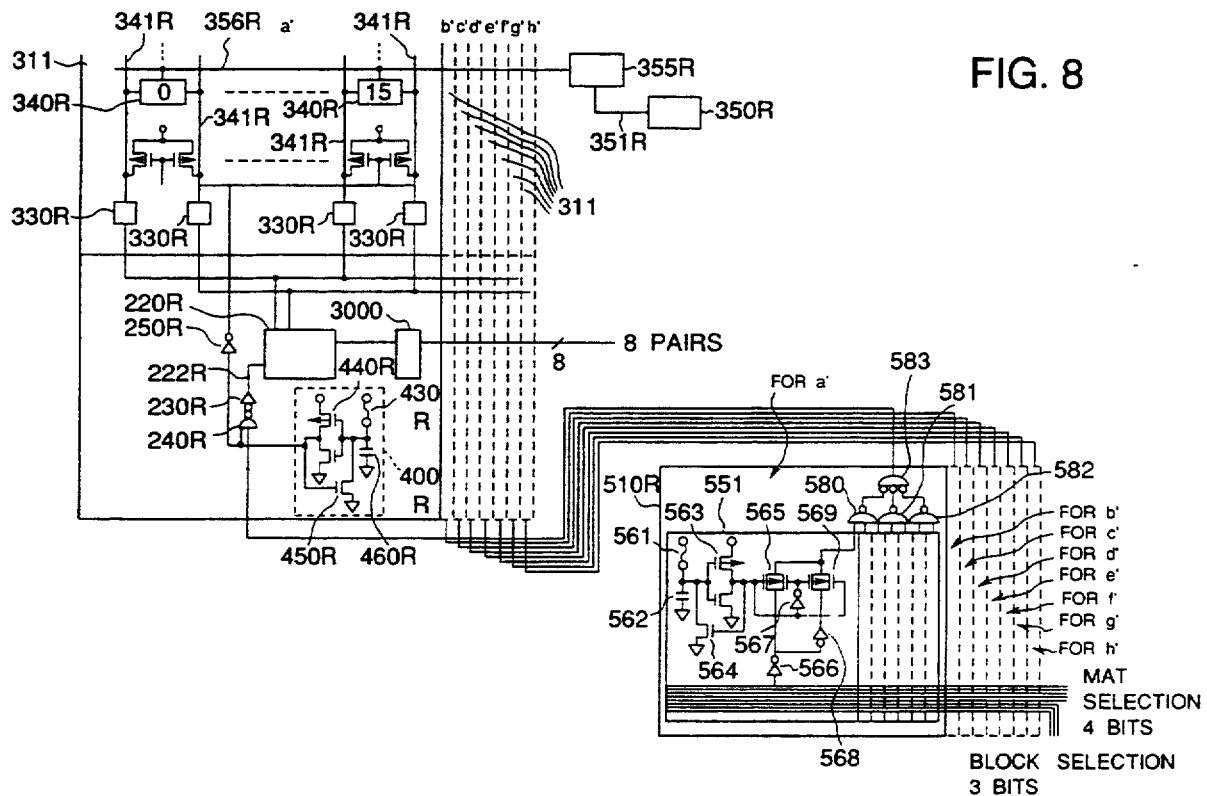

FIG. 8

UNITED STATES PATENT AND TRADEMARK OFFICE
CERTIFICATE OF CORRECTION

PATENT NO. : 5,392,246  Page 4 of 4
DATED : February 21, 1995
INVENTOR(S) : N. AKIYAMA et al.

It is certified that error appears in the above-indentified patent and that said Letters Patent is hereby corrected as shown below:

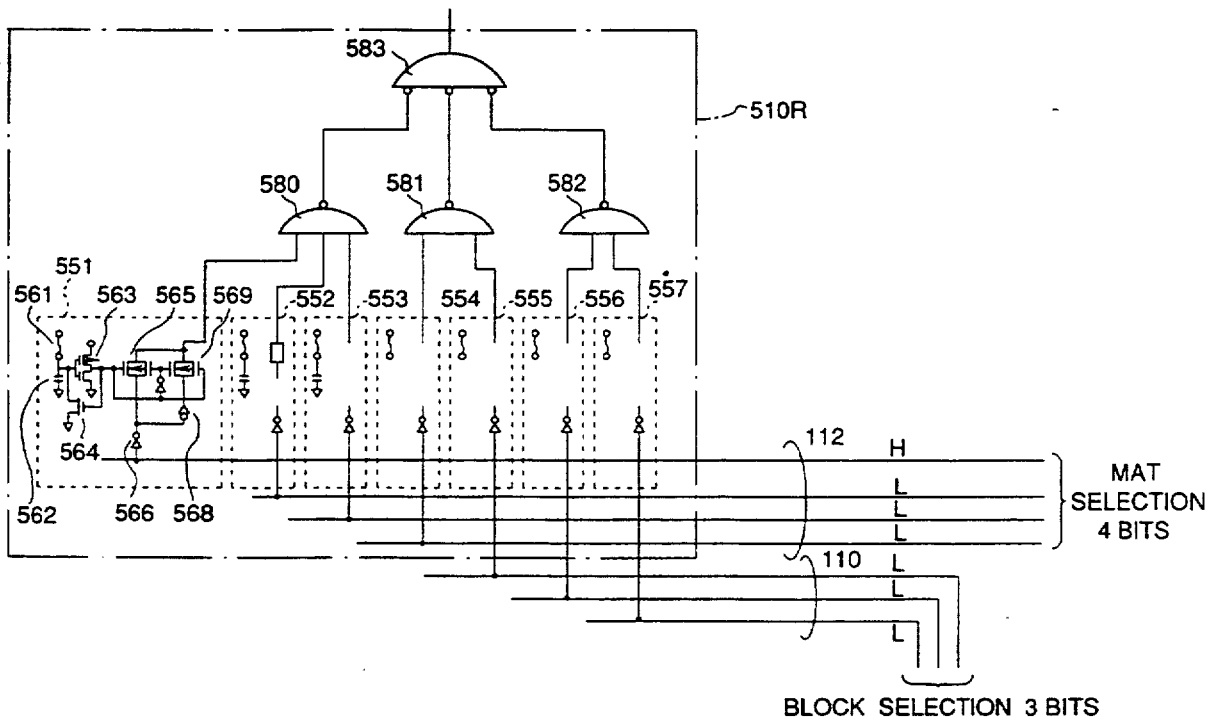

FIG. 9